(12) United States Patent
Kim et al.

(10) Patent No.: US 9,117,696 B2
(45) Date of Patent: Aug. 25, 2015

(54) SEMICONDUCTOR DEVICES HAVING BALANCING CAPACITOR AND METHODS OF FORMING THE SAME

(71) Applicant: Samsung Electronics Co., Ltd., Suwon-Si, Gyeonggi-Do (KR)

(72) Inventors: Jong-Un Kim, Seoul (KR); Yoo-Sang Hwang, Suwon-si (KR); Hyun-Woo Chung, Yongin-si (KR)

(73) Assignee: SAMSUNG ELECTRONICS CO., LTD., Gyeongg-Do (KR)

( * ) Notice: Subject to any disclaimer, the term of this patent is extended or adjusted under 35 U.S.C. 154(b) by 0 days.

(21) Appl. No.: 14/077,834

(22) Filed: Nov. 12, 2013

(65) Prior Publication Data
US 2014/0291804 A1    Oct. 2, 2014

(30) Foreign Application Priority Data

Apr. 1, 2013  (KR) .................. 10-2013-0035315

(51) Int. Cl.
*H01L 21/02* (2006.01)
*H01L 27/108* (2006.01)
*G11C 11/4097* (2006.01)
*G11C 11/4099* (2006.01)

(52) U.S. Cl.
CPC ...... *H01L 27/10897* (2013.01); *G11C 11/4097* (2013.01); *G11C 11/4099* (2013.01); *H01L 27/10814* (2013.01); *H01L 27/10885* (2013.01); *H01L 27/10894* (2013.01)

(58) Field of Classification Search
CPC .............. H01L 27/10897; H01L 27/10814; H01L 27/10885; H01L 27/10894; G11C 11/4099; G11C 11/4097
See application file for complete search history.

(56) References Cited

U.S. PATENT DOCUMENTS

| | | | |
|---|---|---|---|
| 4,807,194 A | 2/1989 | Yamada et al. | |
| 4,916,667 A | 4/1990 | Miyabayashi et al. | |
| 5,715,189 A | 2/1998 | Asakura | |
| 6,004,825 A * | 12/1999 | Seyyedy | 438/3 |
| 6,531,758 B2 | 3/2003 | Shin et al. | |
| 6,656,791 B2 | 12/2003 | Shin et al. | |
| 2001/0000689 A1* | 5/2001 | Kajiyama | 365/149 |
| 2010/0080044 A1 | 4/2010 | Seo et al. | |
| 2013/0033926 A1* | 2/2013 | Seo et al. | 365/149 |

FOREIGN PATENT DOCUMENTS

| | | |
|---|---|---|
| KR | 100346841 | 5/2002 |
| KR | 20020036134 A | 5/2002 |
| KR | 100388223 B1 | 6/2003 |
| KR | 20100013965 A | 2/2010 |

* cited by examiner

*Primary Examiner* — A. Sefer
(74) *Attorney, Agent, or Firm* — Harness, Dickey & Pierce, P.L.C.

(57) ABSTRACT

A semiconductor memory device includes a substrate including cell block, a balancing block, and a sense block. A plurality of cell bit lines are formed in the cell block of. A plurality of cell plugs are formed adjacent to side surfaces of the bit lines. Cell inner spacers, air spacers, and cell outer spacers are formed between the cell bit lines and the cell plugs. A plurality of balancing bit lines are formed in the balancing block. A plurality of balancing plugs are formed adjacent to side surfaces of the balancing bit lines. Balancing inner spacers and balancing outer spacers are formed between the balancing bit lines and the balancing plugs. The balancing bit lines and at least some of the cell bit lines are connected to the sense block.

19 Claims, 34 Drawing Sheets

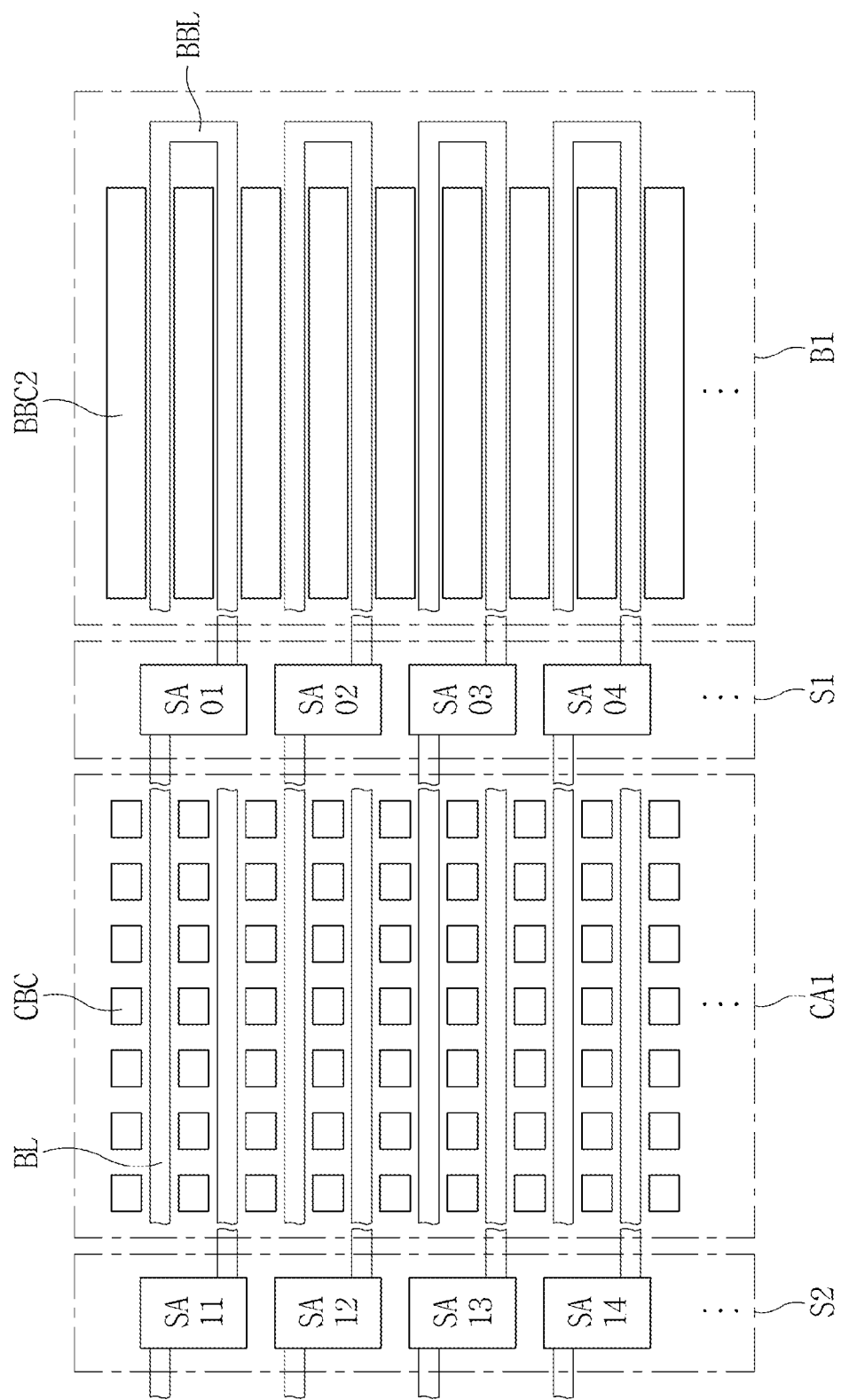

SEMICONDUCTOR DEVICES HAVING BALANCING CAPACITOR AND METHODS OF FORMING THE SAME

CROSS-REFERENCE TO RELATED APPLICATION

This application claims priority under 35 U.S.C. §119 to Korean Patent Application No. 10-2013-0035315 filed on Apr. 1, 2013, the disclosure of which is hereby incorporated by reference in its entirety.

BACKGROUND

1. Field

At least one example embodiment of inventive concepts relates to a semiconductor device including a balancing capacitor connected to a sense amplifier, and/or a method of forming the same.

2. Description of Related Art

In an open bit line DRAM device, as the size of a dummy block reduces, various methods of improving operation characteristics of the DRAM device are being studied.

SUMMARY

At least one example embodiment of inventive concepts provides a semiconductor device including a balancing capacitor configured to reduce the size of a dummy block and ensure reliable operation characteristics, and/or a method of fabricating the semiconductor device.

The technical objectives of inventive concepts are not limited to this disclosure; other objectives may become apparent to those of ordinary skill in the art based on the following descriptions.

According to at least one example embodiment, a semiconductor device includes a substrate including a cell block, a balancing block, and a sense block disposed between the cell block and the balancing block. The semiconductor device also includes a plurality of cell bit lines formed in the cell block of the substrate, a plurality of cell plugs adjacent to side surfaces of the cell bit lines, cell inner spacers formed between the cell bit lines and the cell plugs. The cell inner spacers may be in contact with the side surfaces of the cell bit lines. The semiconductor device may further include cell outer spacers formed on the cell inner spacers. The cell outer spacers may be in contact with the cell plugs. The semiconductor device may also include air spacers disposed between the cell inner spacers and the cell outer spacers, a plurality of balancing bit lines formed in the balancing block of the substrate, a plurality of balancing plugs adjacent to side surfaces of the balancing bit lines, and balancing inner spacers formed between the balancing bit lines and the balancing plugs. The balancing inner spacers may be in contact with the side surfaces of the balancing bit lines. The semiconductor device may further include balancing outer spacers formed on the balancing inner spacers. The balancing outer spacers may be in contact with the balancing plugs. In at least one example embodiment, at least some of the cell bit lines are connected to the sense block, the balancing bit lines are connected to the sense block, and the balancing bit lines, the balancing plugs, the balancing inner spacers, and the balancing outer spacers form a balancing capacitor.

According to at least one example embodiment, the balancing outer spacers are in direct contact with the balancing inner spacers.

According to at least one example embodiment, a first distance between the balancing plugs and the balancing bit lines is less than a second distance between the cell plugs and the cell bit lines.

According to at least one example embodiment, each of the balancing inner spacers has substantially the same thickness as the cell inner spacers.

According to at least one example embodiment, each of the balancing outer spacers has substantially the same thickness as the cell outer spacers.

According to at least one example embodiment, each of the balancing plugs has a greater horizontal width than the cell plugs.

According to at least one example embodiment, the horizontal width of at least one of the balancing plugs is about at least twice that of the cell plugs.

According to at least one example embodiment, each of the air spacers has one of an L-shape, an I-shape, and a bar shape.

According to at least one example embodiment, the plurality of cell bit lines includes first and second cell bit lines parallel to each other in the cell block, and the plurality of balancing bit lines includes first and second balancing bit lines parallel to each other in the balancing block. The first balancing bit line is arranged in the substantially same straight line as the first cell bit line, and the second balancing bit line is arranged in the substantially same straight line as the second cell bit line. The first cell bit line and the second balancing bit line are connected to a sense amplifier in the sense block.

According to at least one example embodiment, the first and second balancing bit lines have substantially the same pitch as the first and second cell bit lines.

According to at least one example embodiment, the first balancing bit line is connected to the second balancing bit line.

According to at least one example embodiment, the semiconductor device of further includes lower electrodes disposed on the cell plugs, a cell capacitor dielectric layer disposed on the lower electrodes, and an upper electrode disposed on the cell capacitor dielectric layer. The upper electrode may be configured to connect to a plate power supply.

According to at least one example embodiment, the balancing plugs are configured to be connected to the plate power supply.

According to at least one example embodiment, a semiconductor device includes a substrate including a balancing block, and a sense block. The semiconductor device includes a plurality of balancing bit lines formed in the balancing block of the substrate. The plurality of balancing bit lines may be connected to the sense block. The semiconductor device includes a plurality of balancing plugs adjacent to side surfaces of the balancing bit lines, and balancing inner spacers formed between the balancing bit lines and the balancing plugs. The balancing inner spacers may be in contact with the side surfaces of the balancing bit lines. The semiconductor device includes balancing outer spacers formed on the balancing inner spacers. The balancing outer spacers may be in contact with the balancing inner spacers and the balancing plugs. The balancing bit lines, the balancing plugs, the balancing inner spacers, and the balancing outer spacers form a balancing capacitor.

According to at least one example embodiment, the balancing plugs are configured to be connected to one of a ground and a plate power supply.

According to at least one example embodiment, a semiconductor device includes a substrate including at least one sense block, and at least one balancing block connected to the at least one sense block. The at least one balancing block includes at least one balancing bit line pair including a first balancing bit line connected to a second balancing bit line, a first spacer and a second spacer sequentially stacked on opposite sides of each of the first and second balancing bit lines, and at least one first contact plug formed adjacent to and in contact with each of the second spacers.

According to at least one example embodiment, the semiconductor device further includes at least one cell block connected to the at least one sense block. The at least one cell block includes at least one cell bit line, a third spacer, a fourth spacer and a fifth spacer sequentially stacked on opposite sides of the at least one cell bit line, and at least one second contact plug formed adjacent to and in contact with each of the fifth spacers.

According to at least one example embodiment, the fourth spacer is an air gap.

According to at least one example embodiment, the first balancing bit line and the second balancing bit line are parallel to one another, one of the first and second balancing bit lines is connected to a sense amplifier of the at least one sense block, and the at least one cell bit line is connected to the sense amplifier.

According to at least one example embodiment, a combined thickness of the first and second spacers is less than a combined thickness of the third, fourth, and fifth spacers.

Details of example embodiments are included in the detailed description and drawings.

BRIEF DESCRIPTION OF THE DRAWINGS

The foregoing and other features and advantages of inventive concepts will be apparent from the more particular description of example embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings:

FIG. 8 is a layout for describing semiconductor devices in accordance with at least one example embodiment of inventive concepts;

DETAILED DESCRIPTION OF EXAMPLE EMBODIMENTS

Figure 1:
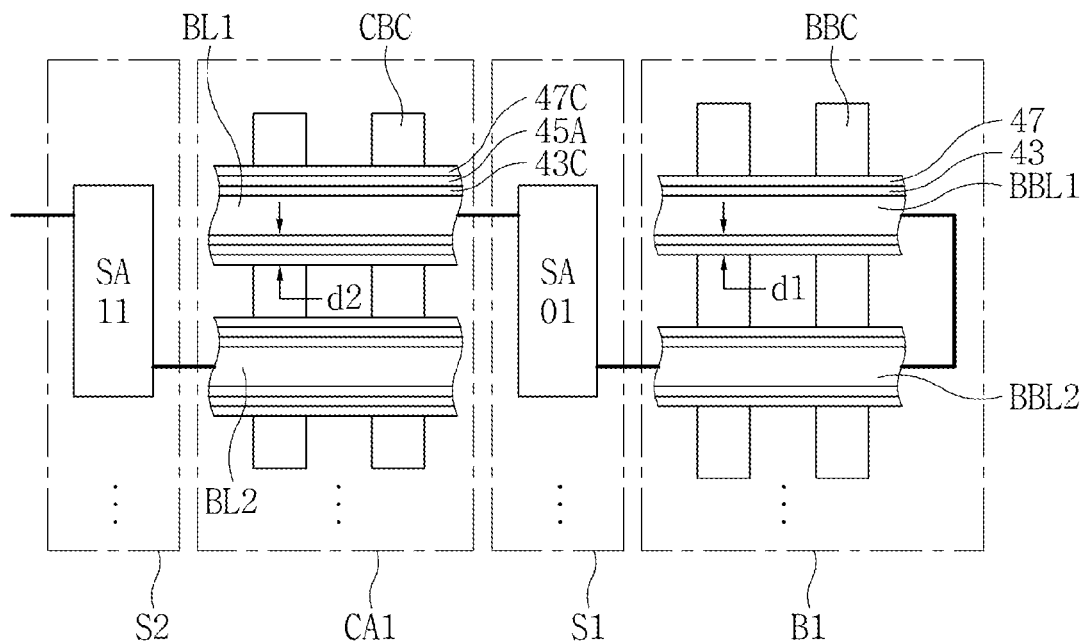
FIG. 1 is a layout for describing a semiconductor device including a balancing capacitor in accordance with at least one example embodiment of inventive concepts.

Various embodiments will now be described more fully with reference to the accompanying drawings in which some example embodiments are shown. Inventive concepts may, however, be embodied in different forms and should not be construed as limited to the example embodiments set forth herein. Rather, these example embodiments are provided so that this disclosure is thorough and complete and fully conveys inventive concepts to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the inventive concepts, such elements should not be construed as limited by these terms. For example, a first element could be termed a second element, and a second element could be termed a first element, without departing from the scope of inventive concepts. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe example embodiments is not intended to limit the scope of inventive concepts. The articles "a," "an," and "the" are singular in that they have a single referent, however the use of the singular form in this description should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein are to be interpreted as is customary in the art to which inventive concepts belong. It will be further understood that terms in common usage should also be interpreted as is customary in the relevant art and not in an idealized or overly formal sense unless expressly so defined herein.

FIG. 1 is a layout for describing a semiconductor device including a balancing capacitor in accordance with at least one example embodiment of inventive concepts.

Referring to FIG. 1, a semiconductor device may include a first balancing block B1, a first cell block CA1, and first and second sense blocks S1 and S2. The first sense block S1 may be arranged between the first balancing block B1 and the first cell block CA1. The first cell block CA1 may be arranged between the first sense block S1 and the second sense block S2. Each of the first and second sense blocks S1 and S2 may include a plurality of sense amplifiers SA01 and SA11, respectively. The first balancing block B1 may include a plurality of balancing bit lines BBL1 and BBL2, a plurality of balancing buried contact (BC) plugs BBC, balancing inner spacers 43, and balancing outer spacers 47. The first cell block CA1 may include a plurality of bit lines BL1 and BL2, a plurality of cell buried contact (BC) plugs CBC, cell inner spacers 43C, air spacers (or air gaps) 45A, and cell outer spacers 47C.

The balancing bit lines BBL1 and BBL2 may be in parallel with one another. The bit lines BL1 and BL2 may be in parallel with in another. The first balancing bit line BBL1 may be arranged in the substantially same straight line as the first bit line BL1, and the second balancing bit line BBL2 may be arranged in the substantially same straight line as the second bit line BL2. The first bit line BL1 may be connected to a first sense amplifier SA01 in the first sense block S1. The second bit line BL2 may be connected to a second sense amplifier SA11 in the second sense block S2. The second balancing bit line BBL2 may be connected to the first sense amplifier SA01 in the first sense block S1. The first balancing bit line BBL1 may be connected to the second balancing bit line BBL2.

The balancing BC plugs BBC may be arranged adjacent to side surfaces of the balancing bit lines BBL1 and BBL2. The balancing inner spacers 43 may be formed on the side surfaces of the balancing bit lines BBL1 and BBL2. The balancing outer spacers 47 may be formed at outer sides of the balancing inner spacers 43. The balancing inner spacers 43 and the balancing outer spacers 47 may be interposed between the balancing BC plugs BBC and the balancing bit lines BBL1 and BBL2. The balancing inner spacers 43 may be in contact (e.g., direct contact) with the balancing bit lines BBL1 and BBL2 and the balancing outer spacers 47. The balancing outer spacers 47 may be in contact (e.g., direct contact) with the balancing BC plugs BBC.

The cell BC plugs CBC may be arranged adjacent to side surfaces of the bit lines BL1 and BL2. The cell inner spacers 43C may be formed on the side surfaces of the bit lines BL1 and BL2. The cell outer spacers 47C may be formed at outer sides of the cell inner spacers 43C. The air spacers 45A may be formed between the cell inner spacers 43C and the cell outer spacers 47C. The cell inner spacers 43C, the air spacers 45A, and the cell outer spacers 47C may be interposed between the cell BC plugs CBC and the bit lines BL1 and BL2. The cell inner spacers 43C may be in direct contact with the bit lines BL1 and BL2. The cell outer spacers 47C may be in direct contact with the cell BC plugs CBC.

The balancing bit lines BBL1 and BBL2 may have substantially the same pitch as the bit lines BL1 and BL2. The balancing bit lines BBL1 and BBL2 may include the same material and be formed at the same time as the bit lines BL1 and BL2. The balancing bit lines BBL1 and BBL2 and the bit lines BL1 and BL2 may have substantially the same horizontal width. The balancing inner spacers 43 may include the same material and be formed at the same time as the cell inner spacers 43C. The balancing inner spacers 43 and the cell inner spacers 43C may have substantially the same thickness. The balancing outer spacers 47 may include the same material and be formed at the same time as cell outer spacers 47C. The balancing outer spacers 47 and the cell outer spacers 47C may have substantially the same thickness.

A first distance d1 between the balancing BC plugs BBC and the balancing bit lines BBL1 and BBL2 may be smaller than a second distance d2 between the cell BC plugs CBC and the bit lines BL1 and BL2. In other words, a combined thickness of the balancing inner spacer 43 and the balancing outer spacer 47 is less than a combined thickness of the cell inner spacer 43C, the air spacer 45A, and the cell outer spacer 47C. Due to the existence of the air spacers 45A, parasitic capacitance between the cell BC plugs CBC and the bit lines BL1 and BL2 may be significantly reduced. Accordingly, data transfer characteristics via the cell BC plugs CBC and the bit lines BL1 and BL2 may be improved. The balancing bit lines BBL1 and BBL2, the balancing inner spacers 43, the balancing outer spacers 47, and the balancing BC plugs BBC may form a balancing capacitor. Capacitance between the balancing BC plugs BBC and the balancing bit lines BBL1 and BBL2 may significantly increase, and operation characteristics of the sense amplifiers SA01 and SA11 may be significantly improved. According to at least one example embodiments of inventive concepts, it is easy to reduce the size of the first balancing block B1.

Figure 2:
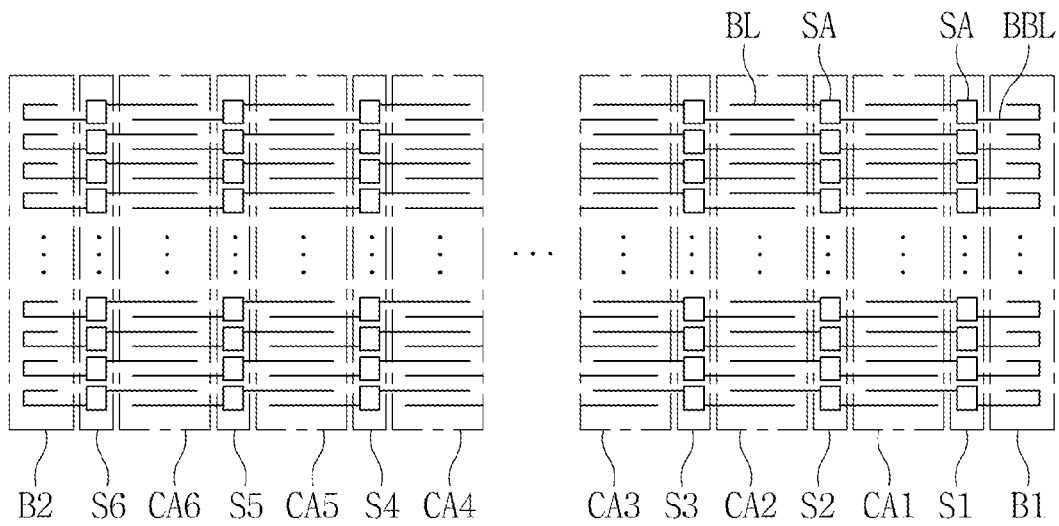
FIG. 2 is a block diagram for describing a semiconductor device in accordance with at least one example embodiment of inventive concepts.

FIG. 2 is a block diagram for describing a semiconductor device in accordance with at least one example embodiment of inventive concepts.

Referring to FIG. 2, the semiconductor device may include first and second balancing blocks B1 and B2, a plurality of cell blocks CA1, CA2, CA3, CA4, CA5, and CA6, and a plurality of sense blocks S1, S2, S3, S4, S5, and S6. The semiconductor device may be a dynamic random access memory (DRAM) having an open bit line structure. A detailed description about the differences between a folded bit line structure and an open bit line structure is omitted from this description for the purpose of brevity.

Each of the first and second balancing blocks B1 and B2 may include a plurality of balancing bit lines BBL arranged in parallel. Each of the cell blocks CA1, CA2, CA3, CA4, CA5, and CA6 may include a plurality of bit lines BL arranged in parallel. Each of the sense blocks S1, S2, S3, S4, S5, and S6 may include a plurality of sense amplifiers SA. The sense blocks 51, S2, S3, S4, S5, and S6 and the cell blocks CA1, CA2, CA3, CA4, CA5, and CA6 may be alternately arranged. The sense blocks 51, S2, S3, S4, S5, and S6 and the cell blocks CA1, CA2, CA3, CA4, CA5, and CA6 may be arranged between the first and second balancing blocks B1 and B2. Each of the balancing bit lines BBL and the bit lines BL may be connected to one selected from the sense amplifiers SA. According to at least one example embodiment of inventive concepts, each of the first and second balancing blocks B1 and B2 may be smaller than the cell blocks CA1, CA2, CA3, CA4, CA5, and CA6. For example, each of the first and second balancing blocks B1 and B2 may have a smaller horizontal width than each of the cell blocks CA1, CA2, CA3, CA4, CA5, and CA6.

Figure 3:
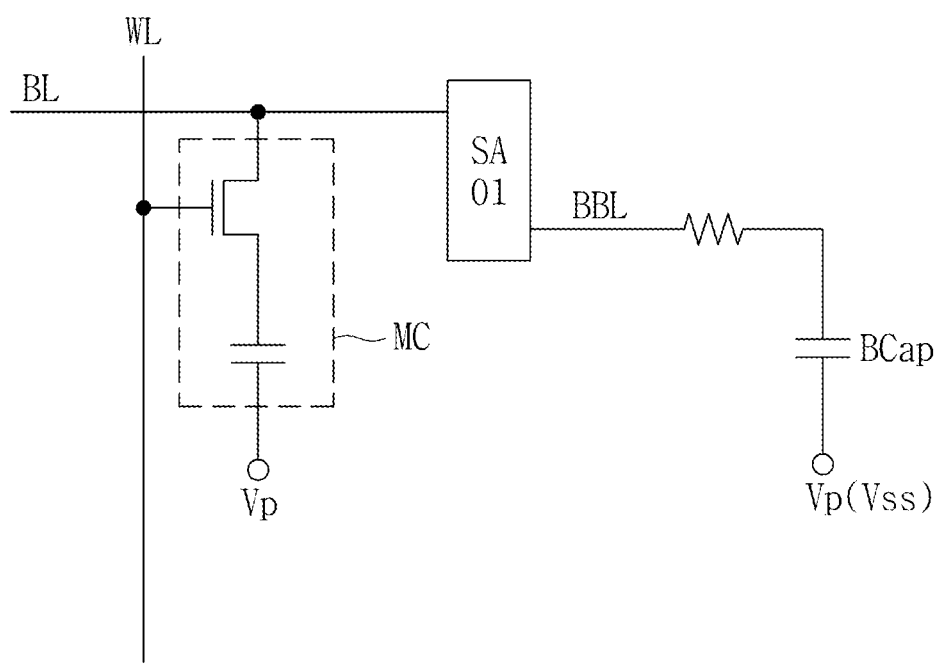
FIG. 3 is an equivalent circuit diagram for describing a part of the configuration of FIG. 2.

FIG. 3 is an equivalent circuit diagram for describing a part of the configuration of FIG. 2.

Referring to FIG. 3, a first sense amplifier SA01 may be arranged between a balancing bit line BBL and a bit line BL. The balancing bit line BBL and the bit line BL may be electrically connected to the first sense amplifier SA01. A word-line WL may be arranged so as to intersect the bit line BL. A memory cell MC may be arranged at an intersection of the bit line BL and the word-line WL. The memory cell MC may include a transistor and a cell capacitor connected to the transistor. An end of the cell capacitor may be connected to a plate power Vp. The memory cell MC may be a DRAM cell. The balancing bit line BBL may be connected to a balancing capacitor BCap. An end of the balancing capacitor BCap may be connected to the plate power Vp or a ground Vss.

Figure 4:
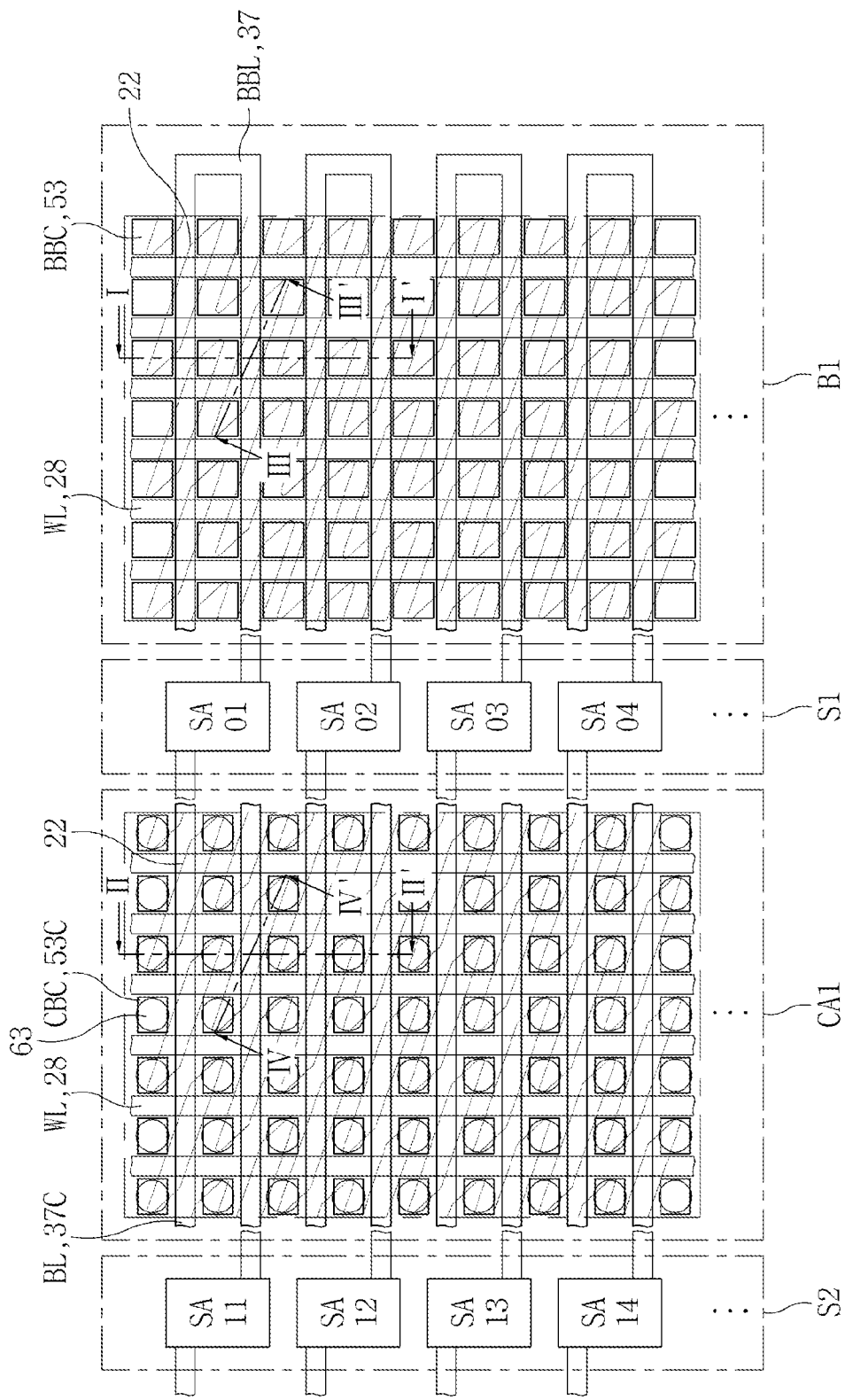
FIG. 4 is a layout corresponding to a part of FIG. 2.

FIG. 4 is a layout corresponding to a part of FIG. 2.

Referring to FIG. 4, a first sense block S1 may be arranged between a first balancing block B1 and a first cell block CA1. The first cell block CA1 may be arranged between the first sense block S1 and a second sense block S2. The first sense block S1 and the second sense block S2 may include a plurality of sense amplifiers SA01, SA02, SA03, SA04, and SA11, SA12, SA13, and SA14, respectively. The first balancing block B1 and the first cell block CA1 may include a plurality of active regions 22 having a constant size and a regular array. The first balancing block B1 and the first cell block CA1 may include a plurality of word-lines (WL, 28) crossing over the active regions 22 and parallel to each other.

The first cell block CA1 may include a plurality of bit lines (BL, 37C) crossing over the active regions 22, intersecting the word-lines (WL, 28), and parallel to each other. A plurality of cell buried contact plugs (cell BC plugs) (CBC, 53C) adjacent to the bit lines (BL, 37C) and connected to the active regions 22, may be formed. Lower electrodes 63 may be formed on the cell BC plugs (CBC, 53C). A half of the bit lines (BL, 37C) may be connected to the first sense block S1, and the other half of the bit lines (BL, 37C) may be connected to the second sense block S2.

The first balancing block B1 may include a plurality of balancing bit lines (BBL, 37) crossing over the active regions 22, intersecting the word-lines (WL, 28), and parallel to each other. A plurality of balancing buried contact plugs (balancing BC plugs) (BBC, 53) adjacent to the balancing bit lines (BBL, 37) and connected to the active regions 22, may be formed. The balancing bit lines (BBL, 37) may be connected to the first sense block S1.

Figure 5:
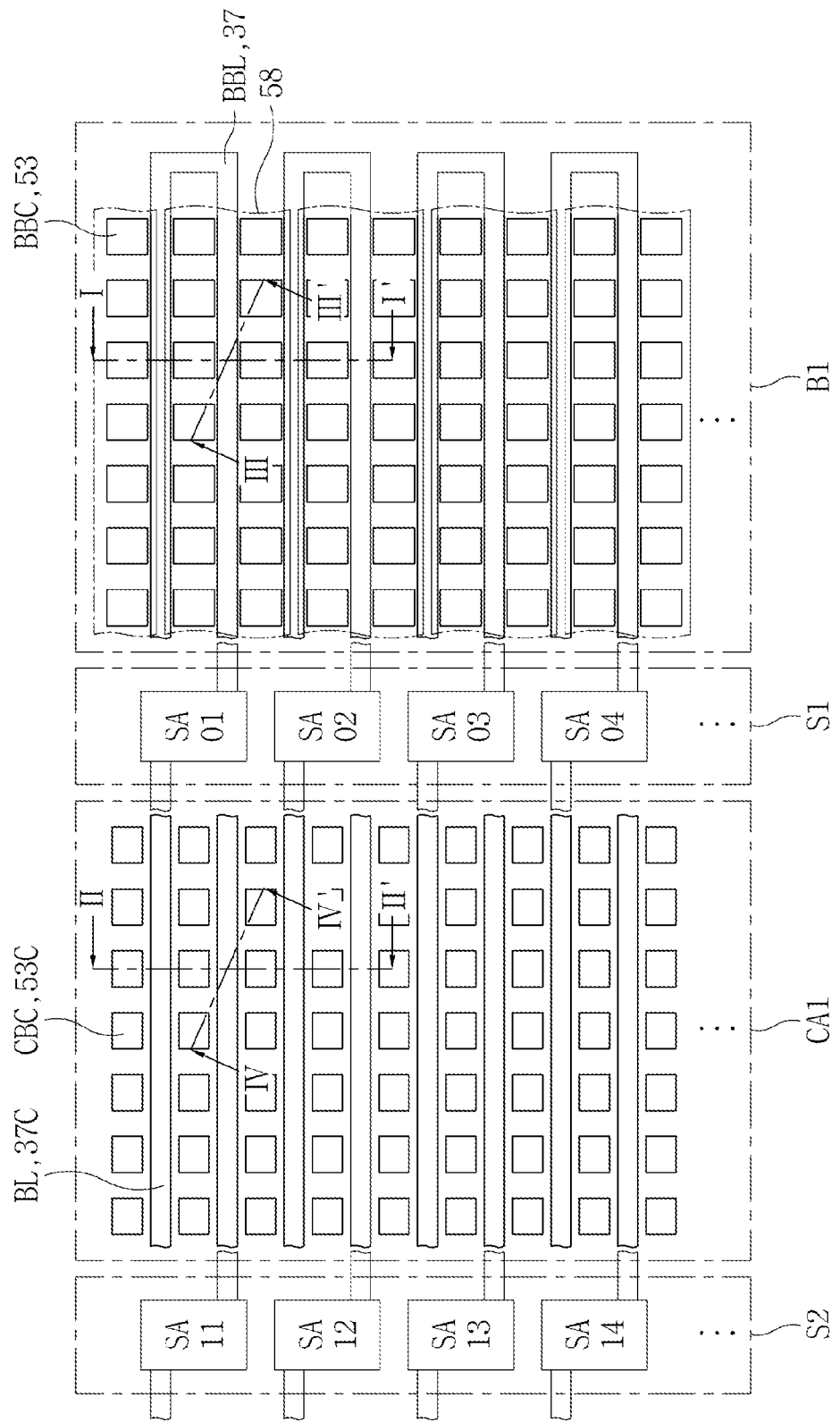
FIG. 5 is a layout showing some of the configuration elements of FIG. 4.

FIG. 5 is a layout showing some of the configuration of the elements of FIG. 4. Referring to FIG. 5, the first balancing block B1 may include intermediate interconnections 58 on the balancing BC plugs (BBC, 53).

Figure 6:
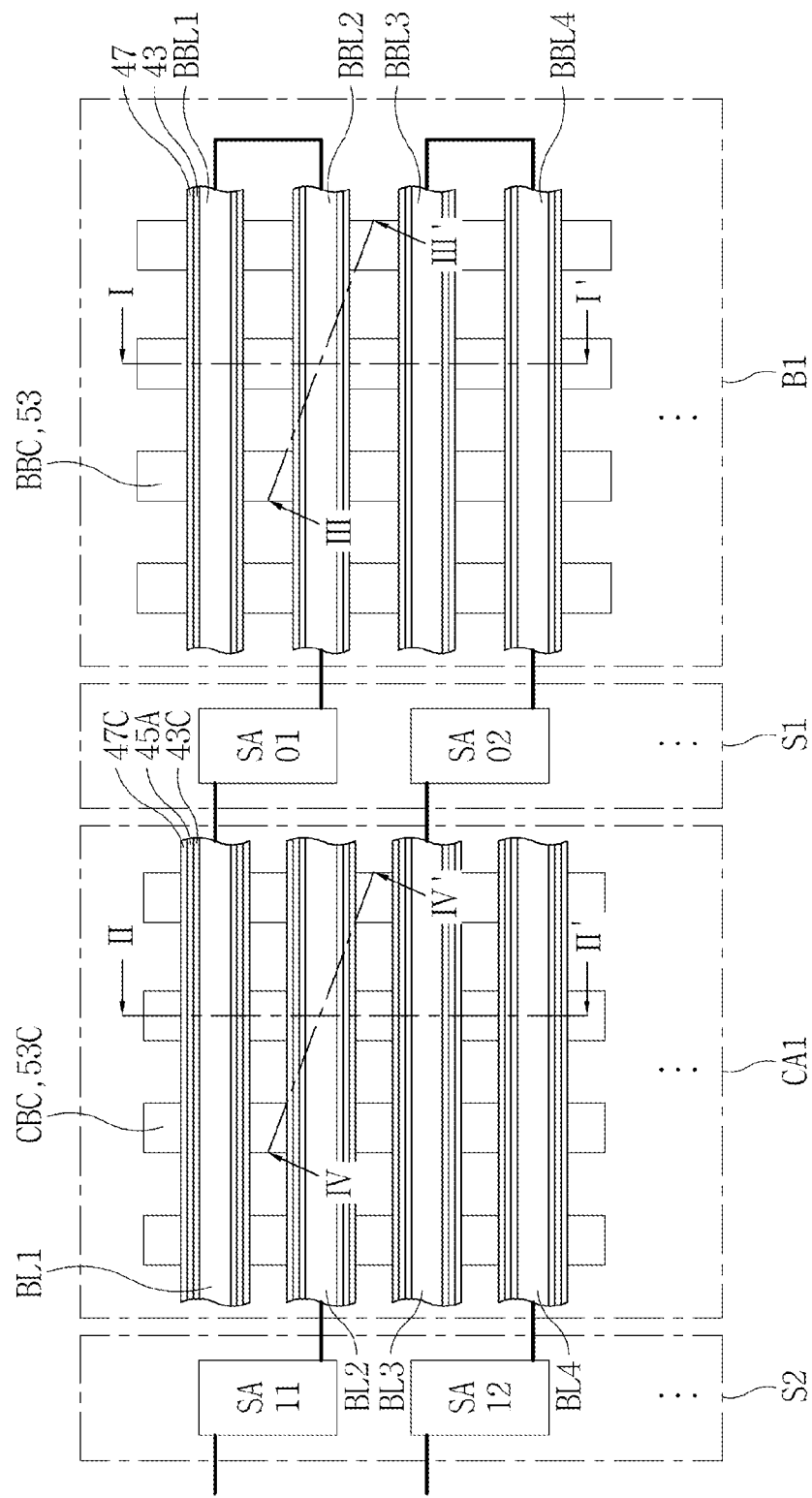
FIG. 6 is an enlarged view showing some of the configuration elements of FIG. 5 in detail.

FIG. 6 is an enlarged view showing some of the configuration of the elements of FIG. 5 in detail.

Referring to FIG. 6, each of the first and second sense blocks S1 and S2 may include a plurality of sense amplifiers SA01/SA02, and SA11/SA12, respectively. The first balancing block B1 may include a plurality of balancing bit lines BBL1, BBL2, BBL3, and BBL4, a plurality of balancing BC plugs (BBC, 53), balancing inner spacers 43, and balancing outer spacers 47. The first cell block CA1 may include a plurality of bit lines BL1, BL2, BL3, and BL4, a plurality of cell BC plugs (CBC, 53C), cell inner spacers 43C, air spacers 45A, and cell outer spacers 47C.

The balancing bit lines BBL1, BBL2, BBL3, and BBL4 may be in parallel with one another. The bit lines BL1, BL2, BL3, and BL4 may be in parallel with one another. A first balancing bit line BBL1 may be arranged in the substantially same straight line as a first bit line BL1. A second balancing bit line BBL2 may be arranged in the substantially same straight line as a second bit line BL2. A third balancing bit line BBL3 may be arranged in the substantially same straight line as a third bit line BL3, and a fourth balancing bit line BBL4 may be arranged in the substantially same straight line as a fourth bit line BL4.

The first bit line BL1 may be connected to a first sense amplifier SA01 in the first sense block S1. The second bit line BL2 may be connected to a second sense amplifier SA11 in the second sense block S2. The second balancing bit line BBL2 may be connected to the first sense amplifier SA01 in the first sense block S1. The first balancing bit line BBL1 may be connected to the second balancing bit line BBL2. The third bit line BL3 may be connected to a third sense amplifier SA02 in the first sense block S1. The fourth bit line BL4 may be connected to a fourth sense amplifier SA12 in the second sense block S2. The fourth balancing bit line BBL4 may be connected to the third sense amplifier SA02 in the first sense block S1. The third balancing bit line BBL3 may be connected to the fourth balancing bit line BBL4.

The balancing BC plugs (BBC, 53) may be arranged adjacent to side surfaces of the balancing bit lines BBL1, BBL2, BBL3, and BBL4. The balancing inner spacers 43 may be formed on the side surfaces of the balancing bit lines BBL1, BBL2, BBL3, and BBL4. The balancing outer spacers 47 may be formed on outer sides of the balancing inner spacers 43. The balancing inner spacers 43 and the balancing outer spacers 47 may be interposed between the balancing BC plugs (BBC, 53) and the balancing bit lines BBL1, BBL2, BBL3, and BBL4. The balancing inner spacers 43 may be in contact (e.g., direct contact) with the balancing bit lines BBL1, BBL2, BBL3, and BBL4 and the balancing outer spacers 47. The balancing outer spacers 47 may be in contact (e.g., direct contact) with the balancing BC plugs (BBC, 53).

The cell BC plugs (CBC, 53C) may be arranged adjacent to side surfaces of the bit lines BL1, BL2, BL3, and BL4. The cell inner spacers 43C may be formed on the side surfaces of the bit lines BL1, BL2, BL3, and BL4. The cell outer spacers 47C may be formed on outer sides of the cell inner spacers 43C. The air spacers 45A may be formed between the cell inner spacers 43C and the cell outer spacers 47C. The cell inner spacers 43C, the air spacers 45A, and the cell outer spacers 47C may be interposed between the cell BC plugs (CBC, 53C) and the bit lines BL1, BL2, BL3, and BL4. The cell inner spacers 43C may be in contact (e.g., direct contact) with the bit lines BL1, BL2, BL3, and BL4. The cell outer spacers 47C may be in contact (e.g., direct contact) with the cell BC plugs (CBC, 53C).

The balancing bit lines BBL1, BBL2, BBL3, and BBL4 may have substantially the same pitch as the bit lines BL1, BL2, BL3, and BL4. The balancing bit lines BBL1, BBL2, BBL3, and BBL4 may include the same material and be formed at the same time as the bit lines BL1, BL2, BL3, and BL4. The balancing bit lines BBL1, BBL2, BBL3, and BBL4 may have substantially the same horizontal width as the bit lines BL1, BL2, BL3, and BL4. The balancing inner spacers 43 may include the same material and be formed at the same time as the cell inner spacers 43C. The balancing inner spacers 43 and the cell inner spacers 43C may have substantially the same thickness. The balancing outer spacers 47 may include the same material and be formed at the same time as the cell outer spacers 47C. The balancing outer spacers 47 and the cell outer spacers 47C may have substantially the same thickness.

Figure 7A:
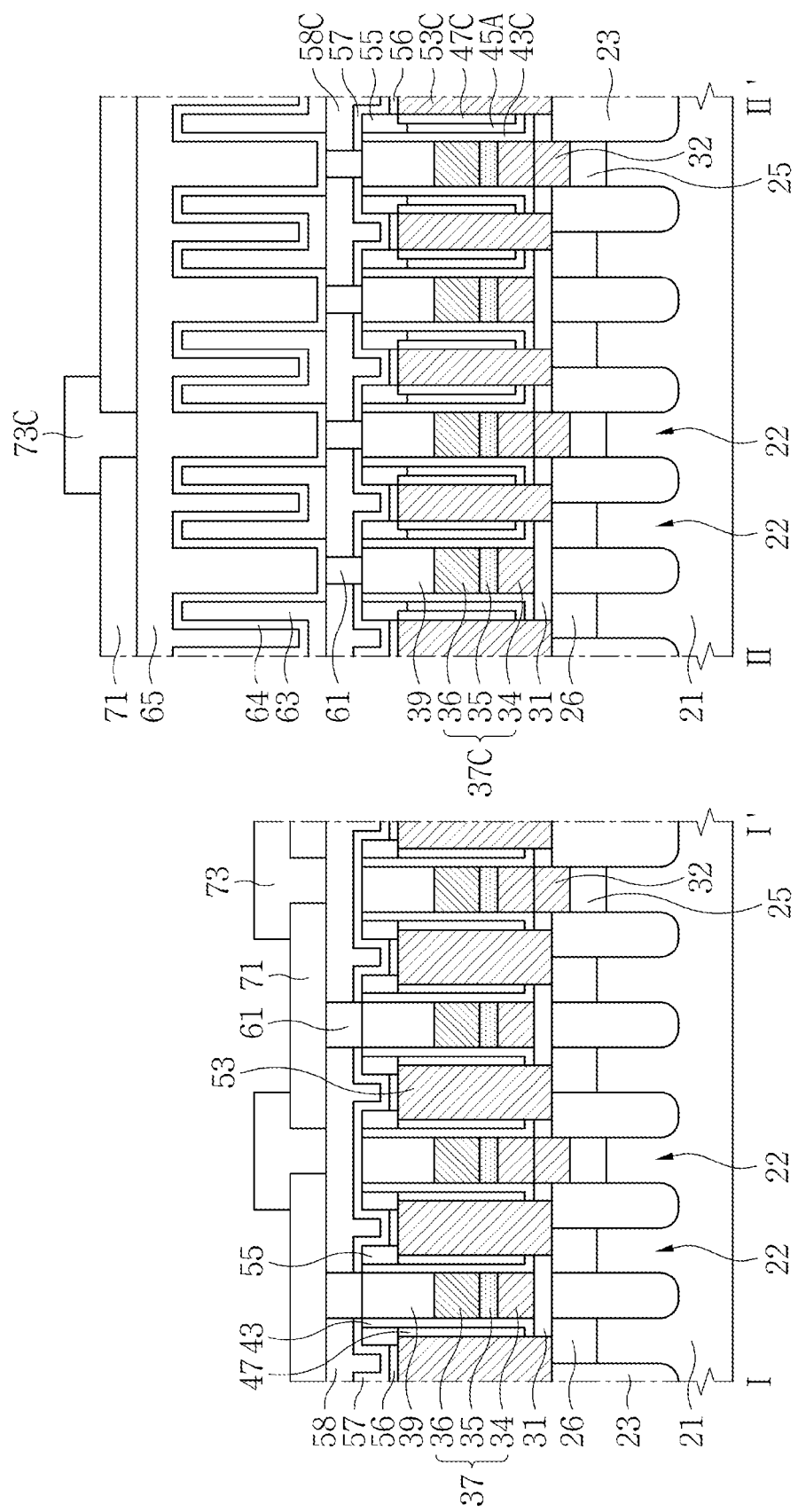
FIGS. 7A and 7B are cross-sectional views taken along lines I-I' and II-II' of FIG. 4.
Figure 7B:
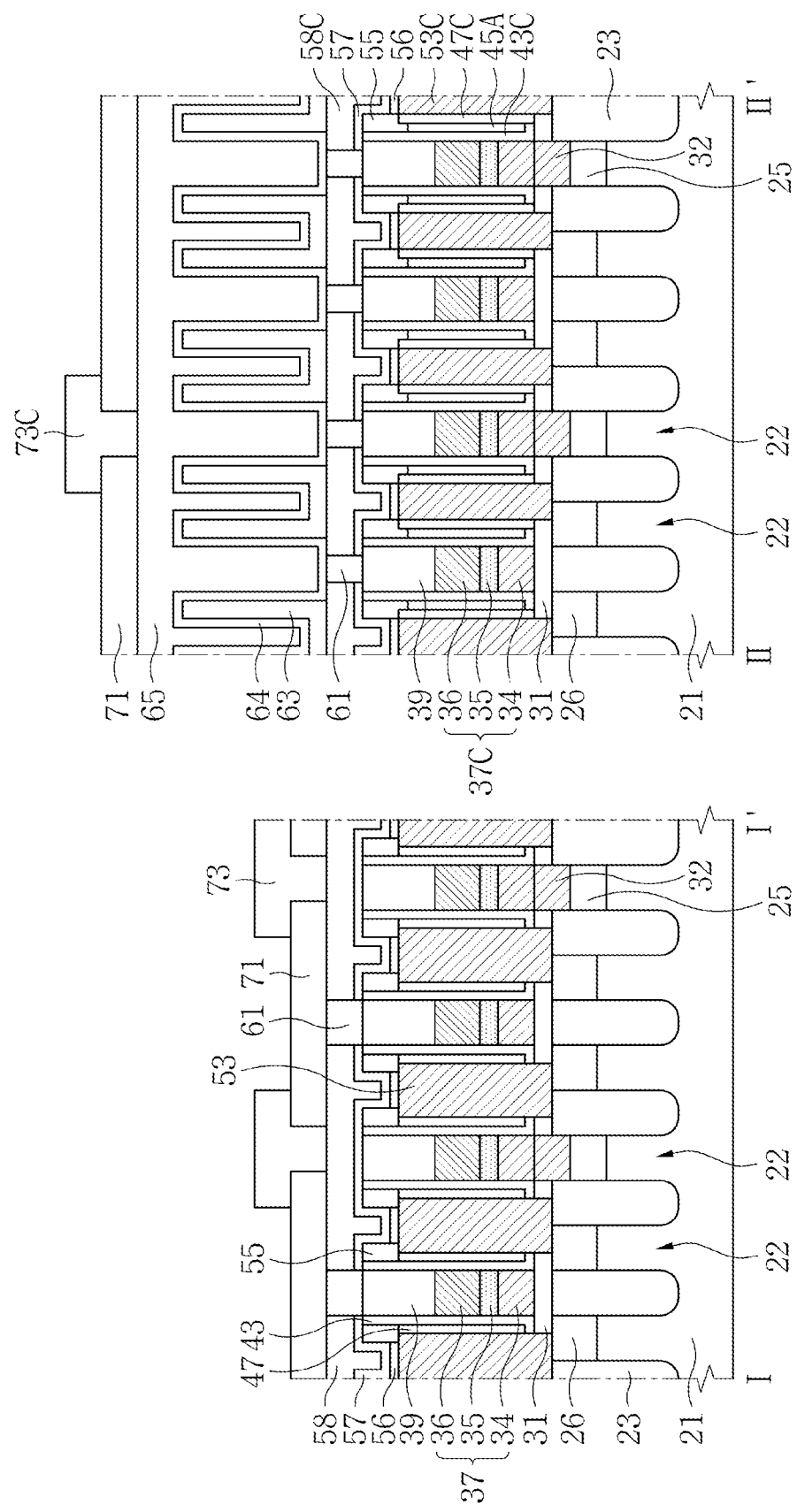

FIGS. 7A and 7B are cross-sectional views taken along lines I-I' and II-IF of FIG. 4.

Referring to FIGS. 4 and 7A/7B, a semiconductor substrate 21 including the first balancing block B1 and a first cell block CA1 may be provided. Active regions 22, a device isolation layer 23, a plurality of first source/drain areas 25, a plurality of second source/drain areas 26, a gate dielectric layer 27, a plurality of word lines 28, a word capping layer 29, a first interlayer insulating layer 31, and bit plugs 32 may be formed in the first balancing block B1 and the first cell block CA1 disposed on the semiconductor substrate 21.

Balancing bit lines 37 connected to the bit plugs 32 may be formed in the first balancing block B1 disposed on the semiconductor substrate 21. Each of the balancing bit lines 37 may include a lower conductive layer 34, an intermediate conductive layer 35, and an upper conductive layer 36. A bit capping pattern 39 may be formed on the balancing bit lines 37. The balancing bit lines 37 may cross over the active regions 22. The balancing bit lines 37 may be in parallel with one another. The balancing bit lines 37 may be electrically connected to the first sense block S1. The balancing bit lines 37 may cross over the word lines 28. Side surfaces of the balancing bit lines 37 may be aligned with side surfaces of the bit capping pattern 39.

Bit lines 37C connected to the bit plugs 32 may be formed in the first cell block CA1 disposed on the semiconductor substrate 21. The bit capping pattern 39 may be formed on the bit lines 37C. The bit lines 37C may include the lower conductive layer 34, the intermediate conductive layer 35, and the upper conductive layer 36. The bit lines 37C may cross over the active regions 22. The bit lines 37C may be in parallel. The bit lines 37C may cross over the word lines 28. The bit lines 37C may have substantially the same pitch as the balancing bit lines 37. The bit lines 37C may have substantially the same horizontal width as the balancing bit lines 37.

Balancing inner spacers 43 covering side surfaces of the balancing bit lines 37 and bit capping pattern 39 may be formed in the first balancing block B1 disposed on the semiconductor substrate 21. The balancing inner spacers 43 may be in contact with the side surfaces of the balancing bit lines 37 and bit capping pattern 39. Balancing outer spacers 47 may be formed on the balancing inner spacers 43. The balancing outer spacers 47 may be in contact with the balancing inner spacers 43. Balancing buried contact plugs (balancing BC plugs) 53 may be formed between the balancing bit lines 37. The balancing BC plugs 53 may pass through the first interlayer insulating layer 31 to be connected to the second source/drain areas 26. The balancing inner spacers 43 and the balancing outer spacers 47 may be interposed between the balancing BC plugs 53 and the balancing bit lines 37.

Cell inner spacers 43C covering side surfaces of the bit lines 37C and bit capping pattern 39 may be formed in the first cell block CA1 disposed on the semiconductor substrate 21. The cell inner spacers 43C may be in contact with the side surfaces of the bit lines 37C and bit capping pattern 39. Air spacers 45A and cell outer spacers 47C may be sequentially formed at outer sides of the cell inner spacers 43C. The air spacers 45A may be interposed between the cell inner spacers 43C and the cell outer spacers 47C. Cell buried contact plugs (cell BC plugs) 53C may be formed between the bit lines 37C. The cell inner spacers 43C, the air spacers 45A, and the cell outer spacers 47C may be interposed between the bit lines 37C and the cell BC plugs 53C. The cell outer spacers 47C may be in contact with the cell BC plugs 53C. The cell BC plugs 53C may pass through the first interlayer insulating layer 31 to be connected to the second source/drain areas 26.

The cell inner spacers 43C may be the same material layer and be formed at the same time as the balancing inner spacers 43. The cell inner spacers 43C and the balancing inner spacers 43 may have substantially the same thickness. The balancing outer spacers 47 and the cell outer spacers 47C may be the same material layer and be formed at the same time. The balancing outer spacers 47 and the cell outer spacers 47C may have substantially the same thickness. Each of the air spacers 45A may have an L-shape. The cell BC plugs 53C and the balancing BC plugs 53 may be the same material layer and be formed at the same time.

Upper ends of the cell BC plugs 53C and balancing BC plugs 53 may be formed at a lower level than upper ends of the bit capping pattern 39. Upper spacers 55 may be formed on the cell BC plugs 53C and the balancing BC plugs 53. The air spacers 45A may be retained under the upper spacers 55. A metal silicide layer 56 may be formed on the cell BC plugs 53C and the balancing BC plugs 53. A barrier layer 57 may be formed on the metal silicide layer 56. Intermediate interconnections 58 may be formed on the barrier layer 57 in the first balancing block B1, and landing pads 58C may be formed on the barrier layer 57 in the first cell block CA1. A third interlayer insulating layer 61 filling gaps between the intermediate interconnections 58 and the landing pads 58C may be formed. Upper ends of the intermediate interconnections 58, landing pads 58C, and third interlayer insulating layer 61 may be formed at the substantially same level.

Lower electrodes 63, a cell capacitor dielectric layer 64, and an upper electrode 65 may be sequentially formed in the first cell block CA1. A fourth interlayer insulating layer 71 covering the entire surface of the semiconductor substrate 21 may be formed. Balancing upper interconnections 73 and the cell upper interconnections 73C may be formed on the fourth interlayer insulating layer 71. The lower electrodes 63 may be connected to the landing pads 58C. Each of the lower electrodes 63 may have a vertical height greater than a horizontal width. Each of the lower electrodes 63 may have a cylinder shape, a crown shape, a pillar shape, or a combination thereof. The cell capacitor dielectric layer 64 may conformally cover side and upper surfaces of the lower electrodes 63. The upper electrode 65 may cover the side and upper surfaces of the lower electrodes 63. The cell capacitor dielectric layer 64 may be interposed between the lower electrodes 63 and the upper electrode 65.

The balancing upper interconnections 73 may pass through the fourth interlayer insulating layer 71 to be connected to the intermediate interconnections 58. The cell upper interconnections 73C may pass through the fourth interlayer insulating layer 71 to be connected to the upper electrode 65. The lower electrodes 63, the cell capacitor dielectric layer 64, and the upper electrode 65 may form cell capacitors. The upper electrode 65 may be connected to a plate power (Vp in FIG. 3) via the cell upper interconnections 73C. The balancing bit lines 37, the balancing BC plugs 53, the balancing inner spacers 43, and the balancing outer spacers 47 may form a balancing capacitor. The balancing inner spacers 43 and the balancing outer spacers 47 may function as a capacitor dielectric layer. The balancing BC plugs 53 may be connected to the plate power (Vp in FIG. 3) or a ground (Vss in FIG. 3) via the intermediate interconnections 58 and the balancing upper interconnections 73.

Referring to FIG. 7B, each of the air spacers 45A may have an I-shape or a bar-shape.

Figure 10:
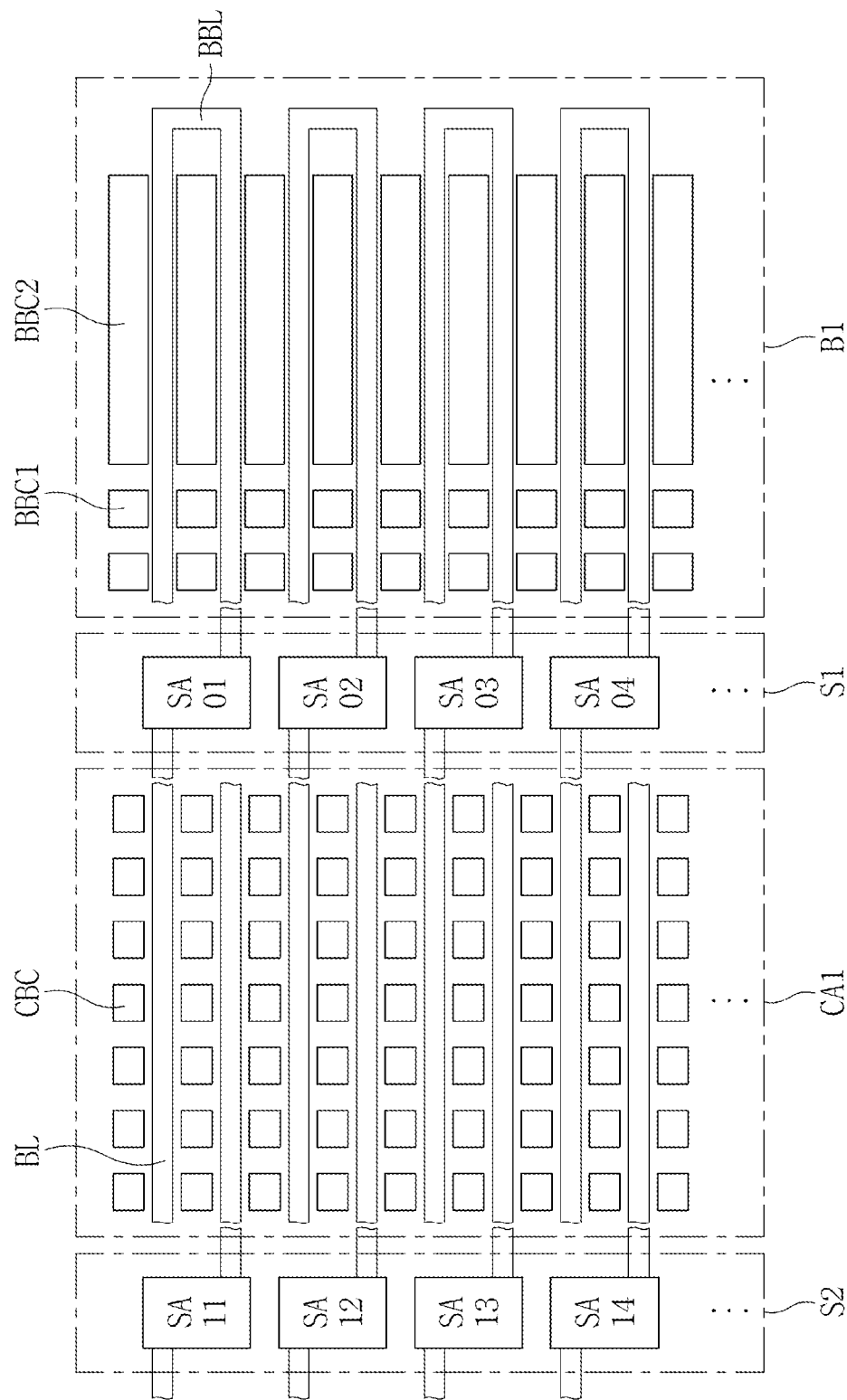
FIGS. 10 and 11 are layouts for describing semiconductor devices in accordance with at least one example embodiment of inventive concepts.
Figure 11:
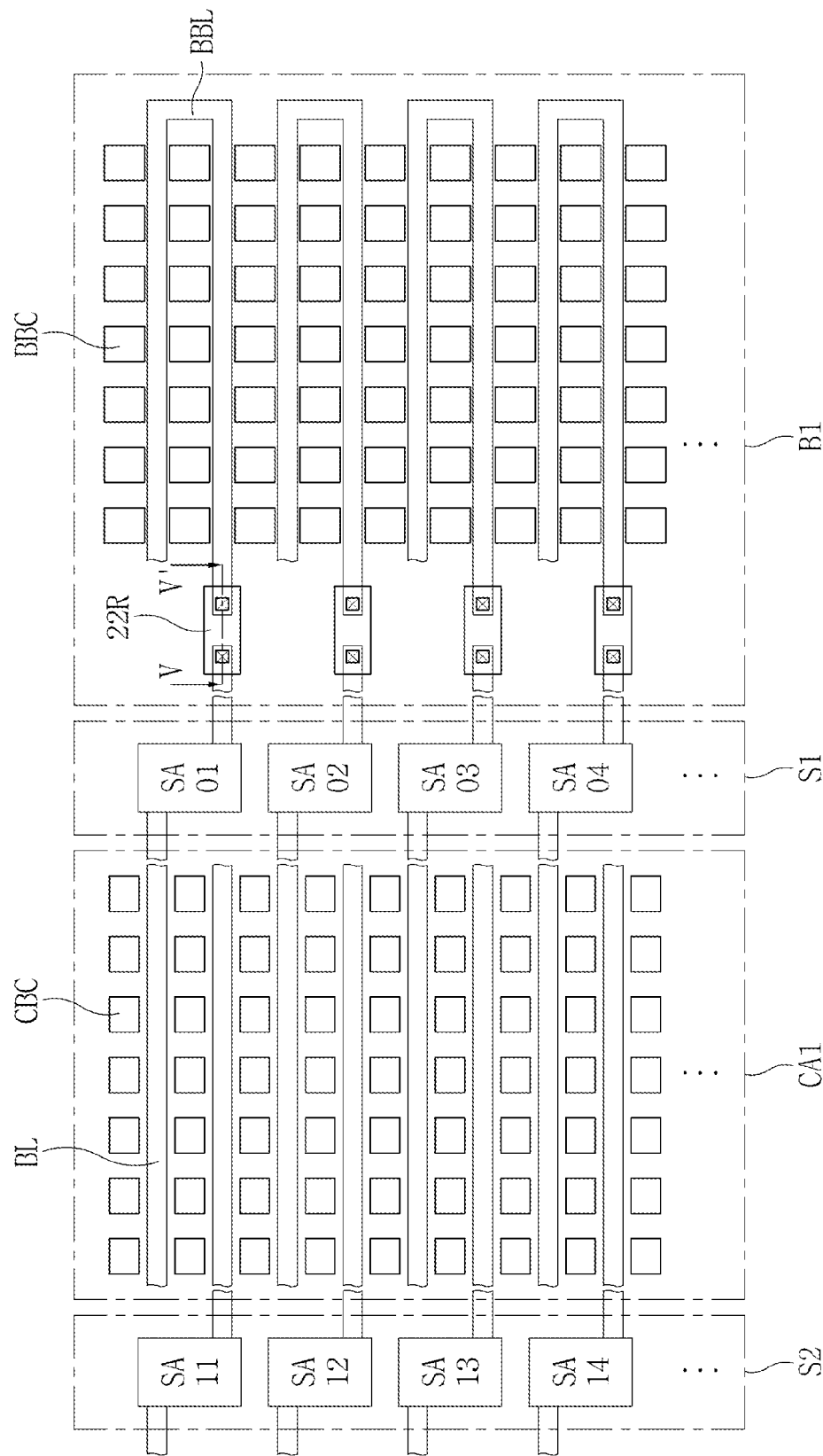

FIGS. 8, 10, and 11 are layouts for describing semiconductor devices in accordance with at least one example embodiment of inventive concepts.

Referring to FIG. 8, balancing bit lines BBL and balancing BC plugs BBC2 may be formed in a first balancing block B1. Bit lines BL and cell BC plugs CBC may be formed in a first cell block CA1. Each of the balancing BC plugs BBC2 may have a greater width than the cell BC plugs CBC. For example, each of the balancing BC plugs BBC2 may have a horizontal width of about twice the cell BC plugs CBC, or more.

Figure 9:
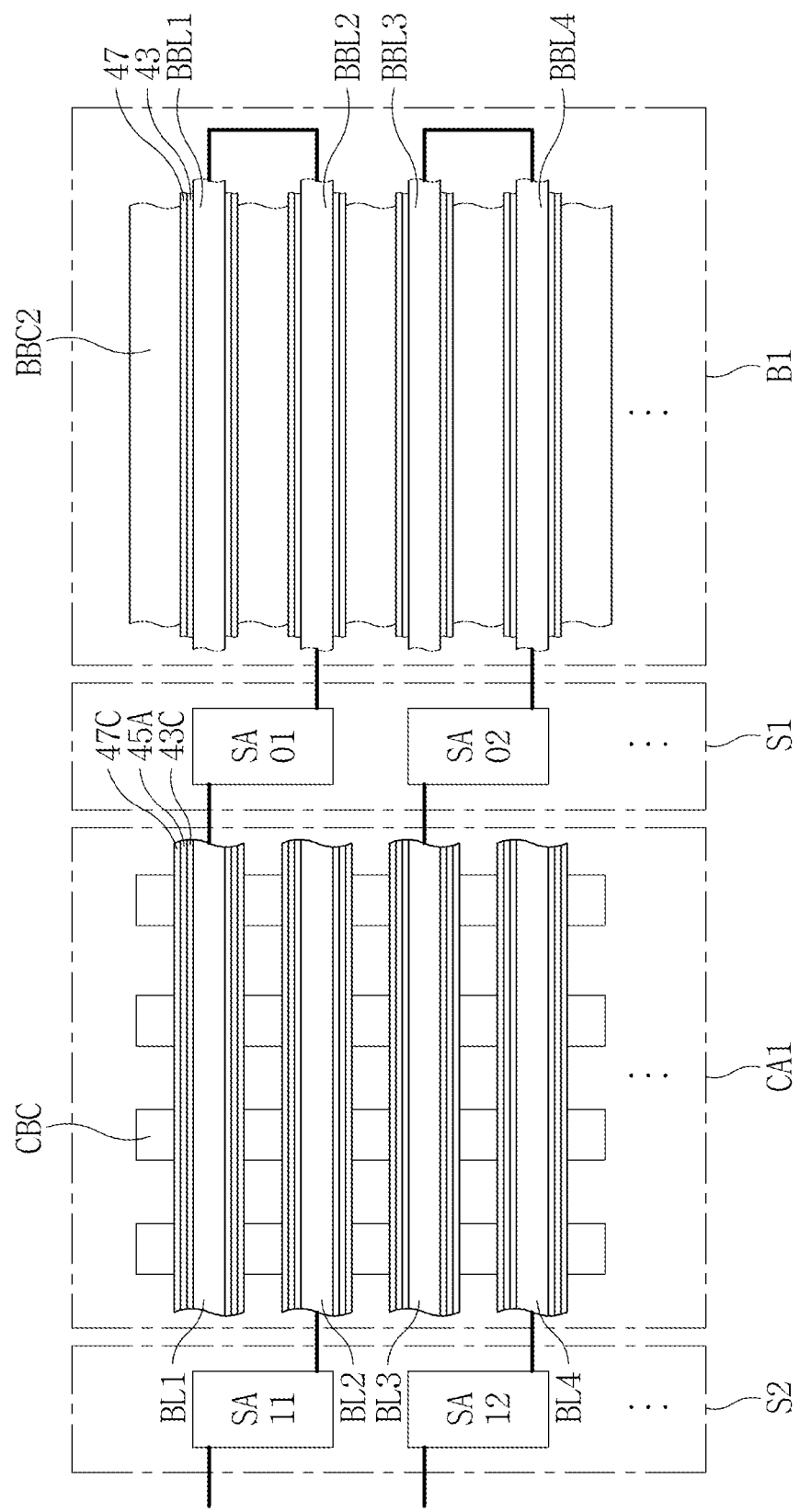
FIG. 9 is an enlarged view showing some of the configuration elements of FIG. 8 in detail.

FIG. 9 is an enlarged view showing some of the configuration of the elements of FIG. 8 in detail.

Referring to FIGS. 8 and 9, each of the first and second sense blocks S1 and S2 may include a plurality of sense amplifiers SA01, SA02, SA11, and SA12. The first balancing block B1 may include a plurality of balancing bit lines BBL1, BBL2, BBL3, and BBL4, a plurality of balancing BC plugs BBC2, balancing inner spacers 43, and balancing outer spacers 47. The first cell block CA1 may include a plurality of bit lines BL1, BL2, BL3, and BL4, a plurality of cell BC plugs CBC, cell inner spacers 43C, air spacers 45A, and cell outer spacers 47C.

Each of the balancing BC plugs BBC2 may have a greater width than the cell BC plugs CBC. The balancing inner spacers 43 and the balancing outer spacers 47 may be interposed between the balancing BC plugs BBC2 and the balancing bit lines BBL1, BBL2, BBL3, and BBL4.

Referring to FIG. 10, balancing bit lines BBL, first balancing BC plugs BBC1, and second balancing BC plugs BBC2 may be formed in a first balancing block B1. Bit lines BL and cell BC plugs CBC may be formed in a first cell block CA1.

Each of the first balancing BC plugs BBC1 may have substantially the same horizontal width and space as the cell BC plugs CBC. Each of the second balancing BC plugs BBC2 may have a greater width than the first balancing BC plugs BBC1 and the cell BC plugs CBC. For example, each of the second balancing BC plugs BBC2 may have a horizontal width of about twice the first balancing BC plugs BBC1, or more. The first balancing BC plugs BBC1 may be arranged adjacent to the first cell block CA1. For example, the first balancing BC plugs BBC1 may be arranged between the first sense block S1 and the second balancing BC plugs BBC2.

Referring to FIG. 11, resistance devices 22R may be formed on a semiconductor substrate 21. For example, the resistance devices 22R may be formed in a first balancing block B1 of the semiconductor substrate 21. Balancing bit lines BBL and balancing BC plugs BBC may form balancing capacitors. Each of the resistance devices 22R may be connected in series between a first sense block S1 and the balancing capacitors.

Figure 12A:
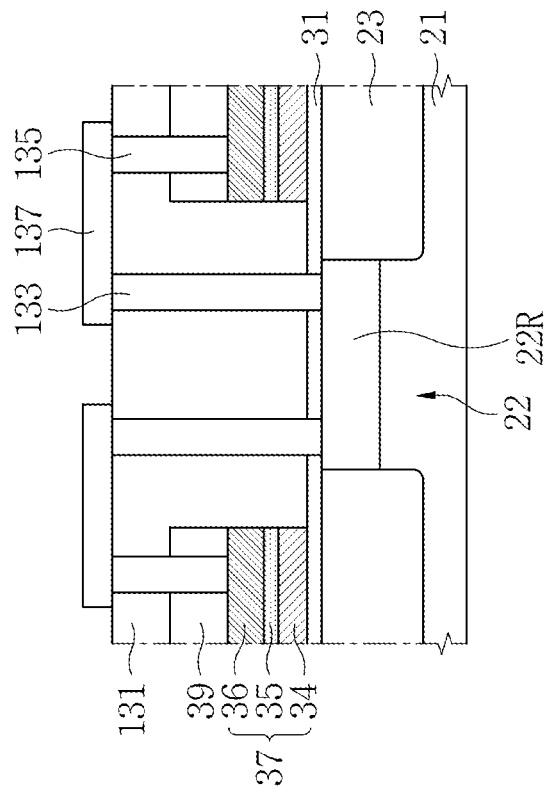
FIG. 12A is a cross-sectional view taken along line V-V' of FIG. 11.

FIG. 12A is a cross-sectional view taken along line V-V' of FIG. 11.

Referring to FIGS. 11 and 12A, a device isolation layer 23 defining active regions 22 may be formed in the first balancing block B1 disposed on the semiconductor substrate 21. The resistance devices 22R may be formed by injecting impurities into desired (or alternatively, predetermined) areas in the active regions 22. The semiconductor substrate 21 and the active regions 22 may be single crystalline silicon including p-type impurities. The resistance devices 22R may include n-type impurities. The resistance devices 22R may be connected to balancing bit lines (BBL, 37) by conductive plugs 32P passing through a first interlayer insulating layer 31. A bit capping pattern 39 may be formed on the balancing bit lines (BBL, 37). An upper insulating layer 131 may be formed on the semiconductor substrate 21.

Figure 12B:
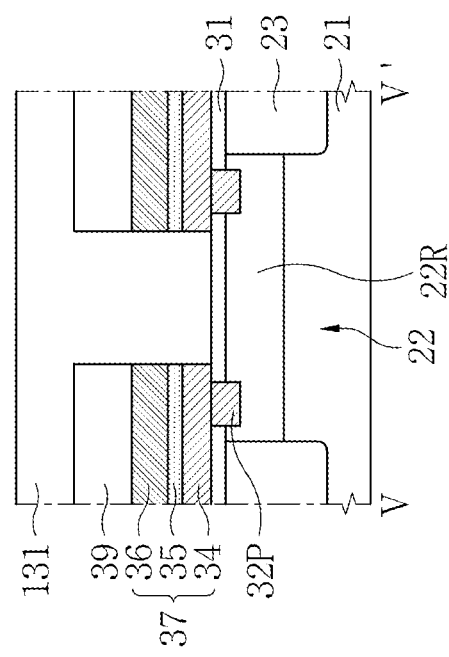
FIG. 12B is a cross-sectional view for describing a semiconductor device in accordance with at least one example embodiment of inventive concepts.

FIG. 12B is an alternative cross-sectional view taken along line V-V' of FIG. 11.

Referring to FIG. 12B, individual interconnections 137 may be formed on an upper insulating layer 131. First plugs 133 passing through the upper insulating layer 131 and the first interlayer insulating layer 31 and in contact with the individual interconnections 137 and the resistance devices 22R, may be formed. Second plugs 135 passing through the upper insulating layer 131 and the bit capping pattern 39 and in contact with the individual interconnections 137 and the balancing bit lines 37, may be formed.

FIGS. 13 to 16, and FIGS. 17A, 18A, 19A, 20A, 21A, 22a, 23a, and 24A are cross-sectional views taken along lines I-I' and III-III' of FIG. 4 for describing methods of fabricating a semiconductor device in accordance with at least one example embodiment of inventive concepts. FIGS. 17B, 18B, 19B, 20B, 21B, 22B, 23B, and 24B are cross-sectional views taken along lines II-II' and IV-IV' of FIG. 4.

Figure 13:
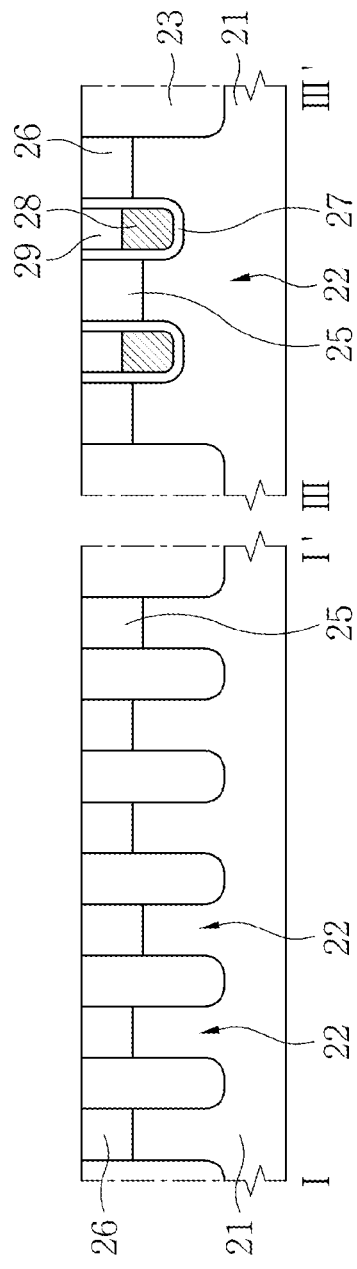
FIGS. 13 to 24B are cross-sectional views taken along lines I-I', III-III', and IV-IV' of FIG. 4 for describing methods of fabricating semiconductor devices in accordance with at least one example embodiment of inventive concepts.

Referring to FIGS. 4 and 13, active regions 22, a device isolation layer 23, a plurality of first source/drain areas 25, a plurality of second source/drain areas 26, a gate dielectric layer 27, a plurality of word lines 28, and a word capping layer 29 may be formed in a first balancing block B1 disposed on a semiconductor substrate 21. The first balancing block B1 may be referred to as a dummy block.

The semiconductor substrate 21 may be a bulk silicon wafer or a silicon on insulator (SOI) wafer. The semiconductor substrate 21 may include a single crystalline semiconductor. The semiconductor substrate 21 may include p-type impurities. The device isolation layer 23 may be formed using a shallow trench isolation (STI) process. The device isolation layer 23 may include an insulating material, such as silicon oxide, silicon nitride, silicon oxynitride, or a combination thereof. The active regions 22 may be defined by the device isolation layer 23 formed in the semiconductor substrate 21. In a plan view, the active regions 22 may have a uniform size and a form a uniform and repetitive array. For example, the active regions 22 may be a single crystalline semiconductor including p-type impurities.

The word lines 28 may cross over the active regions 22. The word lines 28 may be in parallel. The gate dielectric layer 27 may be formed between the word lines 28 and the active regions 22. The first source/drain areas 25 and the second source/drain areas 26 may be formed in the active regions 22 adjacent to both sides of the word lines 28. The word capping layer 29 may be formed on the word lines 28. The word lines 28 may be formed at a lower level than upper ends of the active regions 22. Upper ends of the word lines 28 may be formed at a lower level than upper ends of the first source/drain areas 25 and second source/drain areas 26. Lower ends of the first source/drain areas 25 may be formed at a lower level than the second source/drain areas 26.

The gate dielectric layer 27 may include silicon oxide, silicon nitride, silicon oxynitride, a high-K dielectric material, or a combination thereof. The word lines 28 may include a conductive material, such as a metal, a metal silicide, polysilicon, or a combination thereof. The word capping layer 29 may include an insulating material, such as silicon oxide, silicon nitride, silicon oxynitride, or a combination thereof. The first source/drain areas 25 and the second source/drain areas 26 may be formed by injecting impurities into the active regions 22. For example, the first source/drain areas 25 and the second source/drain areas 26 may include n-type impurities.

Figure 14:
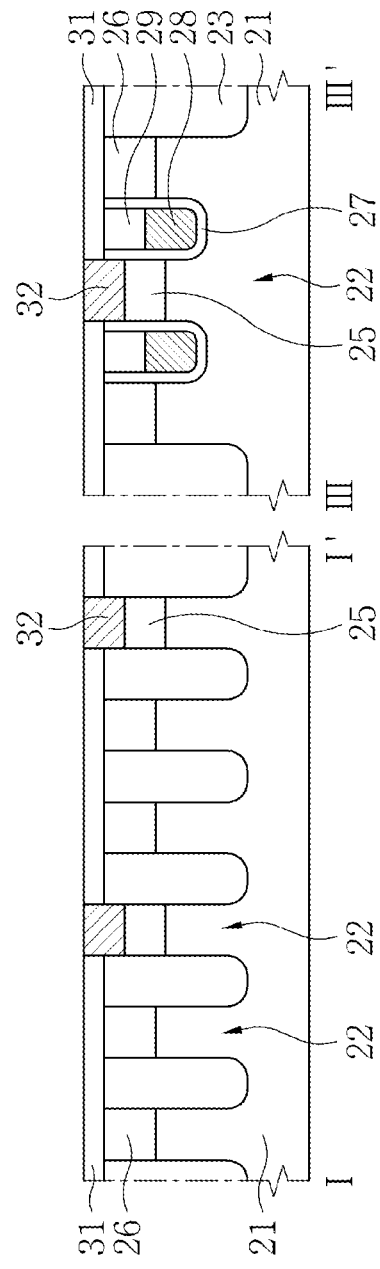

Referring to FIGS. 4 and 14, a first interlayer insulating layer 31 covering the semiconductor substrate 21 may be formed. Bit plugs 32 passing through the first interlayer insulating layer 31 and in contact with the first source/drain areas 25 may be formed. The first interlayer insulating layer 31 may include an insulating material, such as silicon oxide, silicon nitride, silicon oxynitride, or a combination thereof. The bit plugs 32 may include a conductive material, such as a metal, a metal silicide, polysilicon, or a combination thereof. For example, the bit plugs 32 may be a polysilicon layer including n-type impurities.

Figure 15:
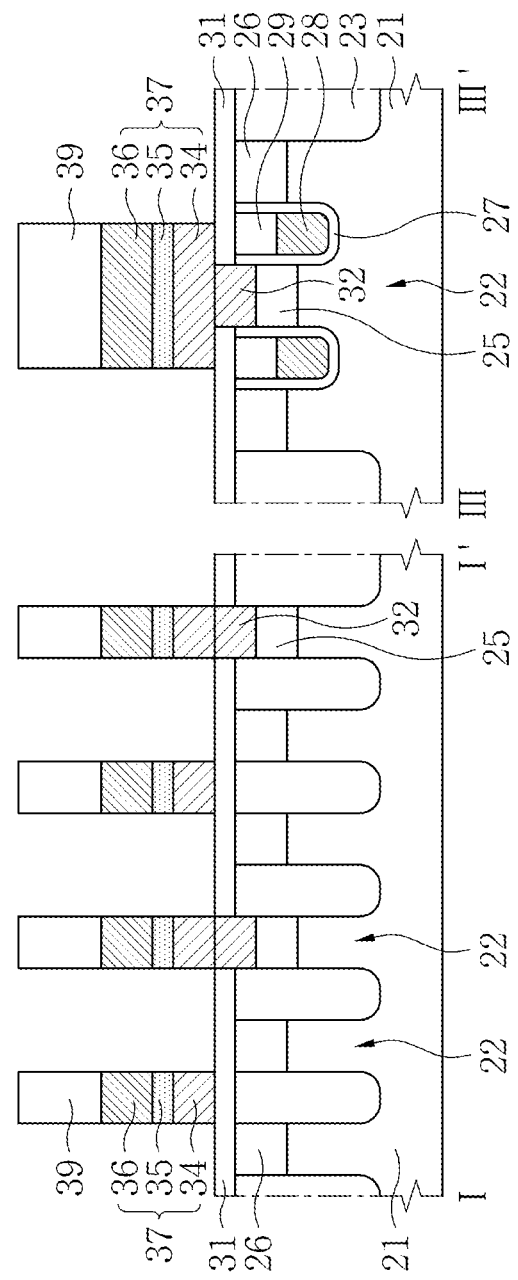

Referring to FIGS. 4 and 15, balancing bit lines 37 connected to the bit plugs 32 may be formed on the first interlayer insulating layer 31. Each of the balancing bit lines 37 may include a lower conductive layer 34, an intermediate conductive layer 35, and an upper conductive layer 36. A bit capping pattern 39 may be formed on the balancing bit lines 37. The balancing bit lines 37 may cross over the active regions 22. The balancing bit lines 37 may be in parallel. The balancing bit lines 37 may be electrically connected to a first sense block S1. The balancing bit lines 37 may cross over the word lines 28. The formation of the balancing bit lines 37 and the bit capping pattern 39 may include a thin-film formation process and a patterning process. Side surfaces of the balancing bit lines 37 may be aligned with side surfaces of the bit capping pattern 39.

The balancing bit lines 37 may include a conductive material, such as a metal, a metal silicide, polysilicon, or a combination thereof. For example, the lower conductive layer 34 may be a polysilicon layer including n-type impurities. The intermediate conductive layer 35 may include a metal silicide layer, a barrier layer, or a combination thereof. The intermediate conductive layer 35 may include CoSi, NiSi, TiSi, TaSi, WSi, Ti, TiN, Ta, TaN, or a combination thereof. The upper conductive layer 36 may include W, WN, Ti, TiN, Ta, TaN, Ni, Co, or a combination thereof. The bit capping pattern 39 may include an insulating material, such as silicon oxide, silicon nitride, silicon oxynitride, or a combination thereof.

Figure 16:
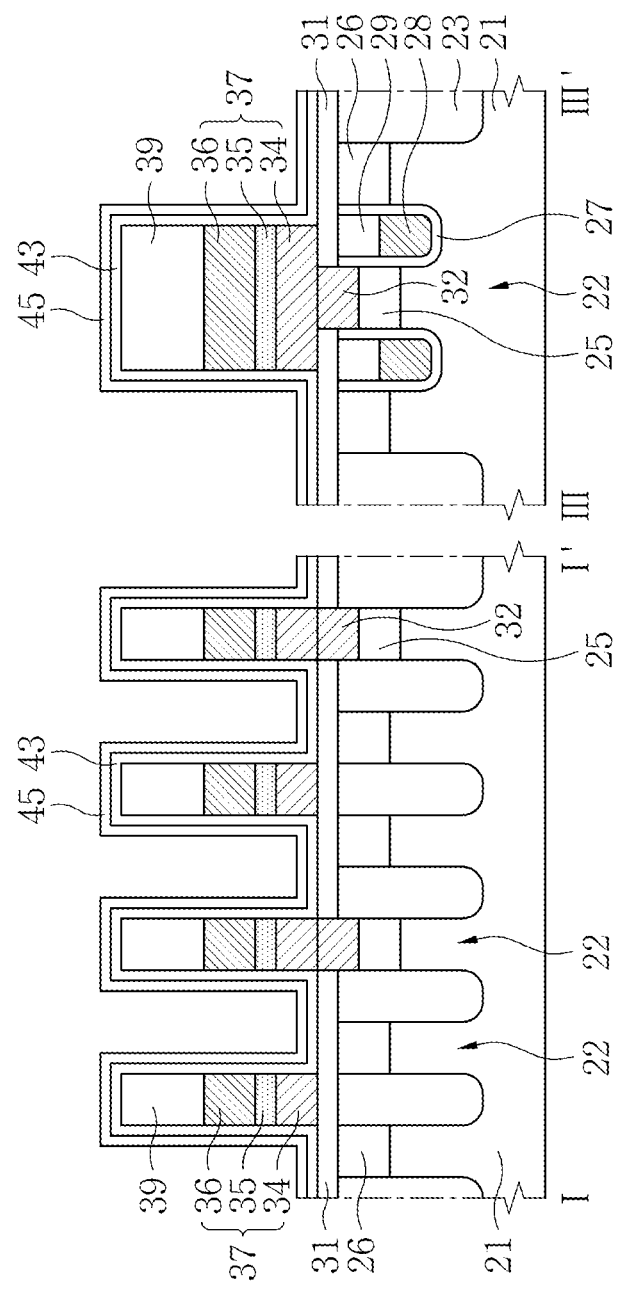

Referring to FIGS. 4 and 16, balancing inner spacers 43 and sacrificial spacers 45 covering the side surfaces of the balancing bit lines 37 and bit capping pattern 39 may be sequentially formed. The balancing inner spacers 43 may conformally cover the side surfaces of the balancing bit lines 37 and bit capping pattern 39. The sacrificial spacers 45 may cover the balancing inner spacers 43. The sacrificial spacers 45 may include a material having an etch selectivity with respect to the balancing inner spacers 43. For example, the balancing inner spacers 43 may include silicon nitride, and the sacrificial spacers 45 may include silicon oxide.

Figure 17A:
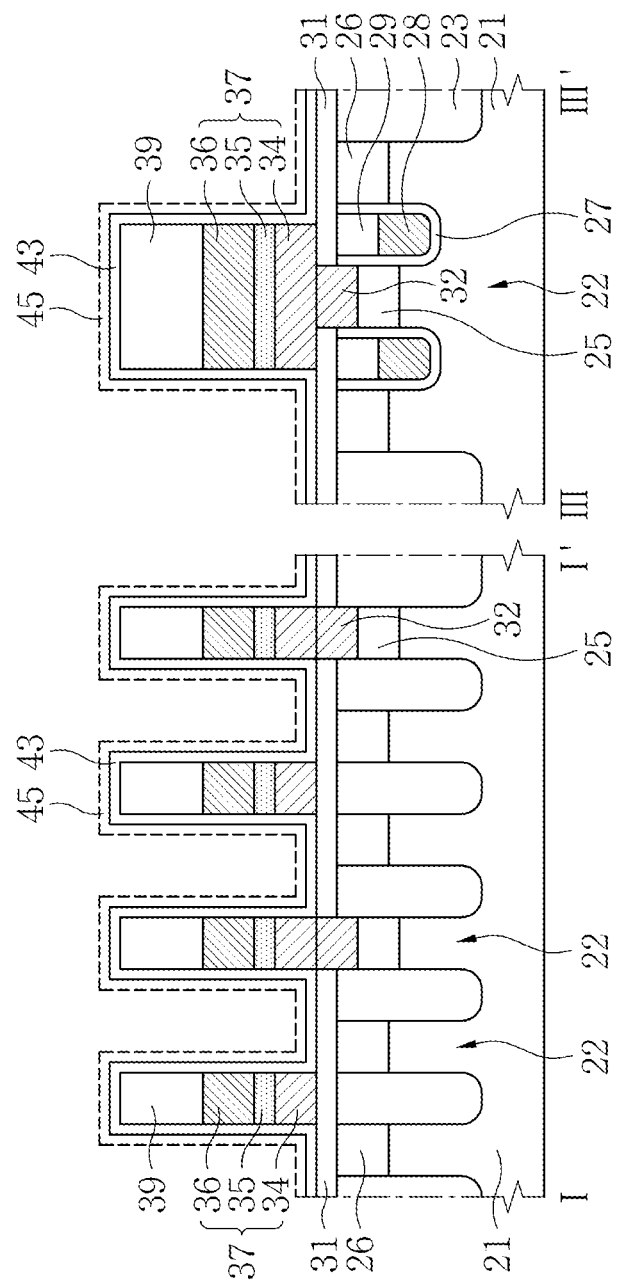
Figure 17B:
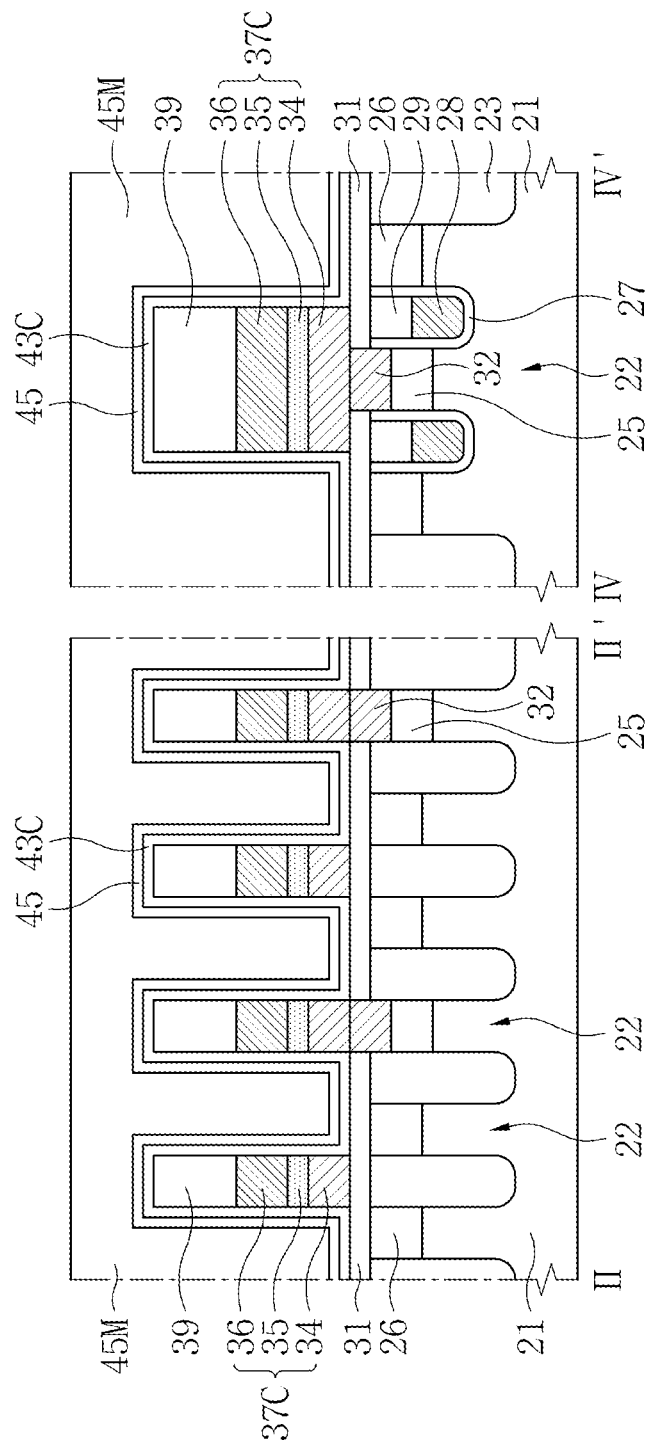

Referring to FIGS. 4, 17A, and 17B, the active regions 22, the device isolation layer 23, the plurality of first source/drain areas 25, the plurality of second source/drain areas 26, the gate dielectric layer 27, the plurality of word lines 28, the word capping layer 29, the first interlayer insulating layer 31, the bit plugs 32, the lower conductive layer 34, the intermediate conductive layer 35, the upper conductive layer 36, the bit capping pattern 39, the cell inner spacers 43C, and the sacrificial spacers 45 may be formed in a first cell block CA1 disposed on the semiconductor substrate 21. The lower conductive layer 34, intermediate conductive layer 35, and upper conductive layer 36 in the first cell block CA1 may form bit lines 37C. The bit lines 37C may cross over the active regions 22. The bit lines 37C may be in parallel. The bit lines 37C may have substantially the same pitch as the balancing bit lines 37. The bit lines 37C may cross over the word lines 28. The bit lines 37C may have substantially the same horizontal width as the balancing bit lines 37.

The cell inner spacers 43C may be the same material layer formed at the same time as the balancing inner spacers 43. The cell inner spacers 43C and the balancing inner spacers 43 may have substantially the same thickness. The cell inner spacers 43C may conformally cover side surfaces of the bit lines 37C and bit capping pattern 39. The sacrificial spacers 45 may cover the cell inner spacers 43C.

A mask pattern 45M covering the first cell block CA1 and exposing the first balancing block B1 may be formed on the semiconductor substrate 21. The sacrificial spacers 45 in the first cell block CA1 may be covered by the mask pattern 45M, and the sacrificial spacers 45 in the first balancing block B1 may be exposed. The sacrificial spacers 45 in the first balancing block B1 may be removed using an isotropic etch process and/or a cleaning process, to expose the balancing inner spacers 43. The sacrificial spacers 45 in the first cell block CA1 may be retained under the mask pattern 45M.

Figure 18A:
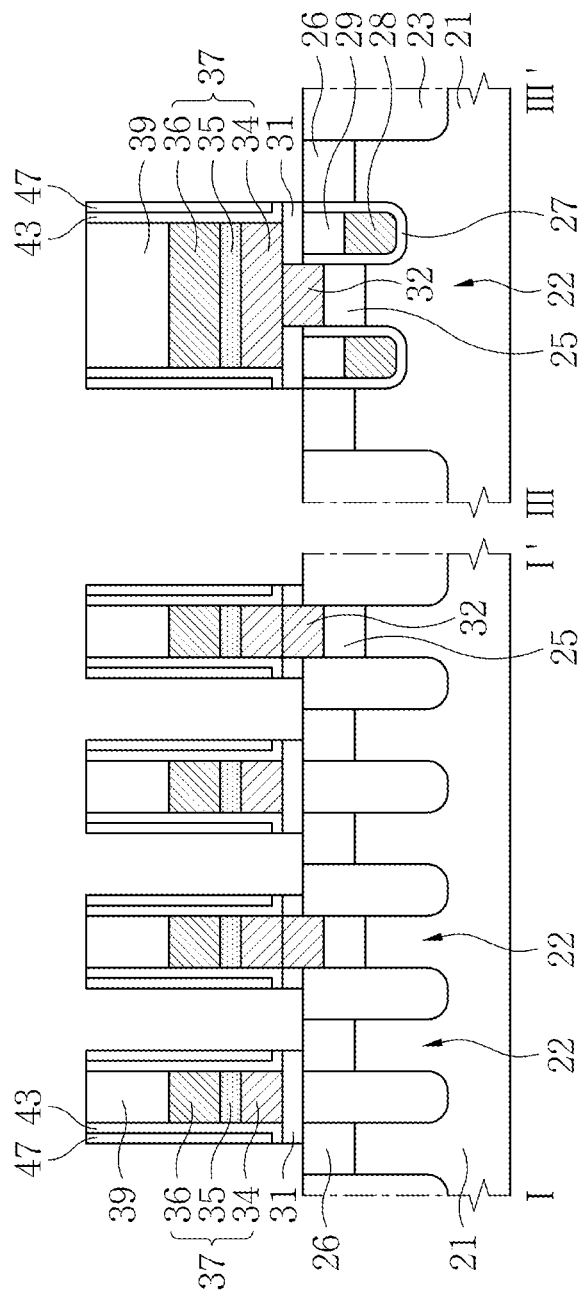
Figure 18B:
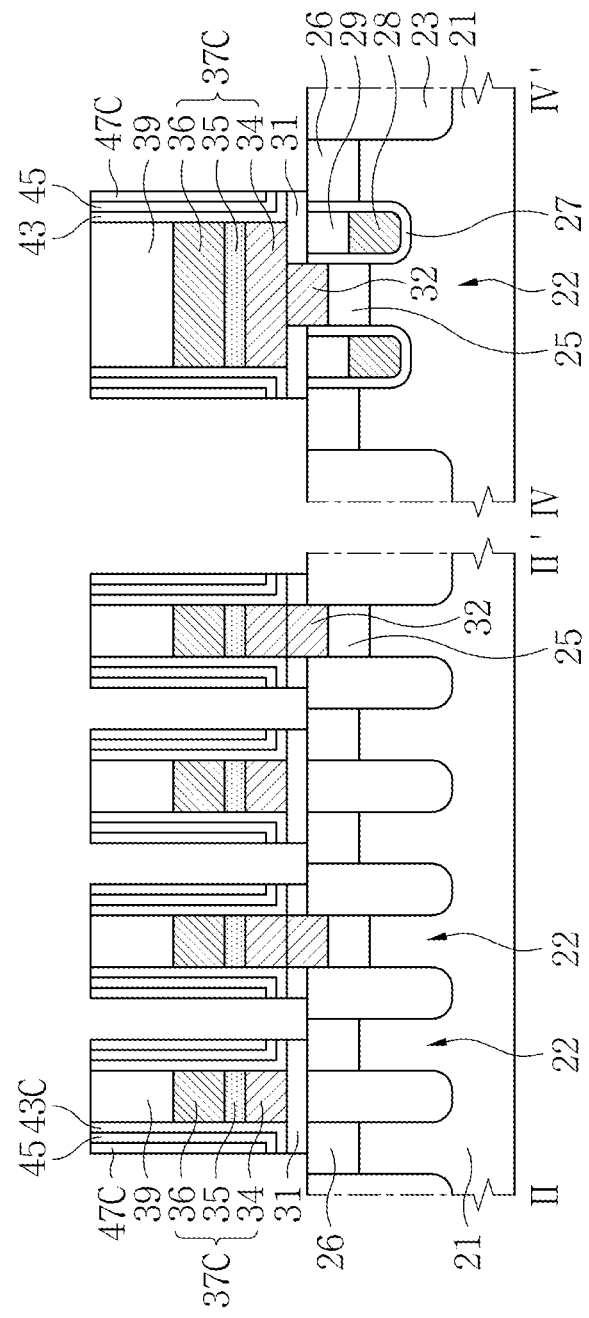

Referring to FIGS. 18A and 18B, the mask pattern 45M may be removed to expose the sacrificial spacers 45 in the first cell block CA1. Using a thin-film formation process and an anisotropic etch process, balancing outer spacers 47 may be formed on the balancing inner spacers 43 in the first balancing block B1, and cell outer spacers 47C may be formed on the sacrificial spacers 45 in the first cell block CA1. An upper surface of the bit capping pattern 39 may be exposed. The first interlayer insulating layer 31 may also be partially removed to expose the second source/drain areas 26 and the device isolation layer 23.

The cell outer spacers 47C may be formed of a material layer having an etch selectivity with respect to the sacrificial spacers 45. The balancing outer spacers 47 and the cell outer spacers 47C may be the same material layer and be formed at the same time. The balancing outer spacers 47 and the cell outer spacers 47C may include a nitride material, such as silicon nitride, silicon oxynitride, or a combination thereof. The balancing outer spacers 47 and the cell outer spacers 47C may have substantially the same thickness.

Figure 19A:
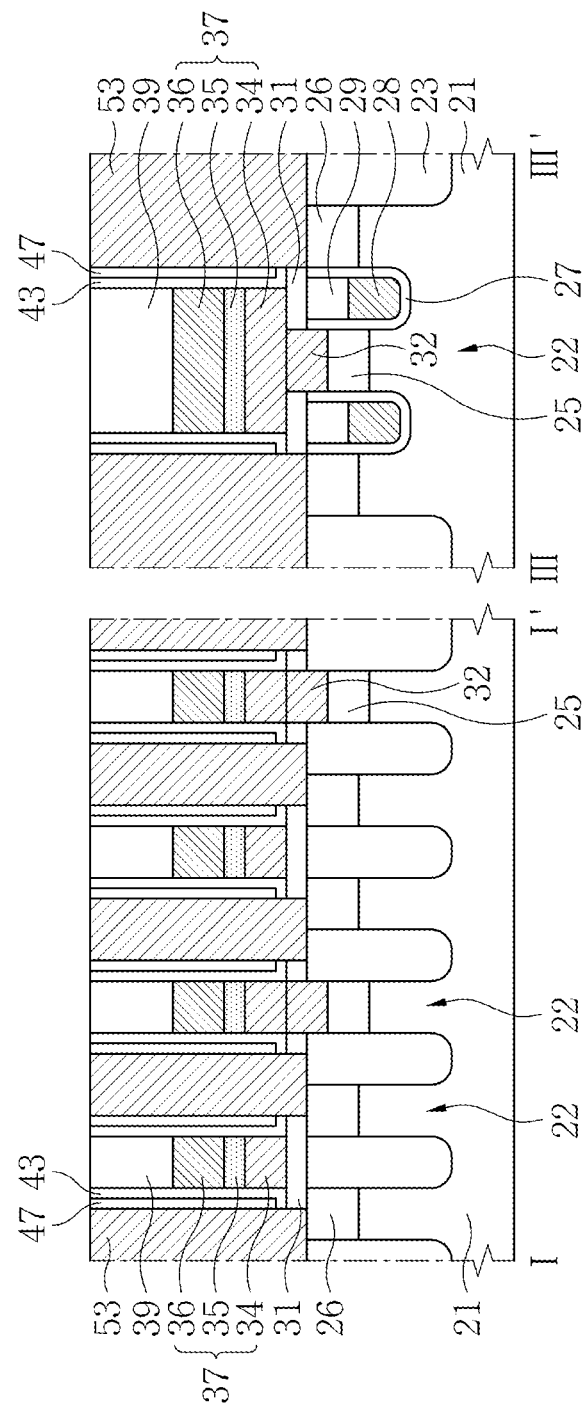
Figure 19B:
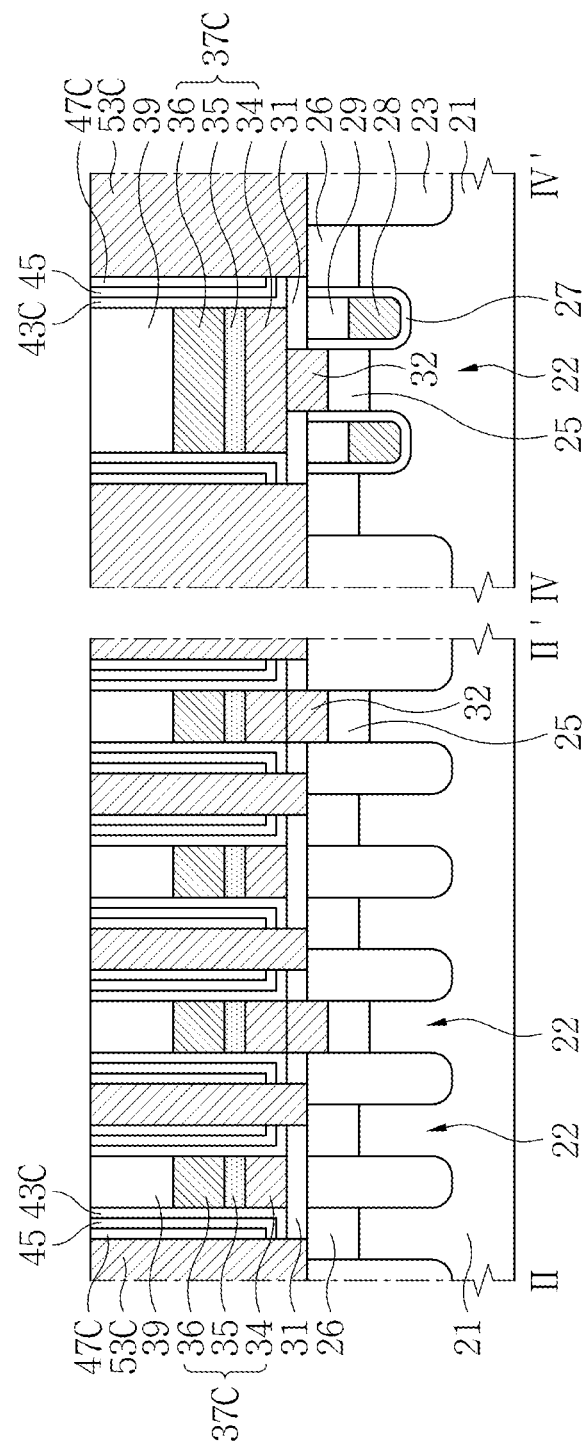

Referring to FIGS. 4, 19A, and 19B, cell buried contact plugs (cell BC plugs) 53C filling between the bit lines 37C, and balancing buried contact plugs (balancing BC plugs) 53 filling between the balancing bit lines 37 may be formed using a thin-film formation process and a planarization process. The planarization process may include a chemical mechanical polishing (CMP) process, an etch-back process, or a combination thereof. The cell BC plugs 53C and the balancing BC plugs 53 may include a polysilicon layer, a metal layer, a metal silicide layer, or a combination thereof. For example, the cell BC plugs 53C and the balancing BC plugs 53 may include polysilicon containing n-type impurities. The cell BC plugs 53C and the balancing BC plugs 53 may be in contact with the second source/drain areas 26.

Figure 20A:
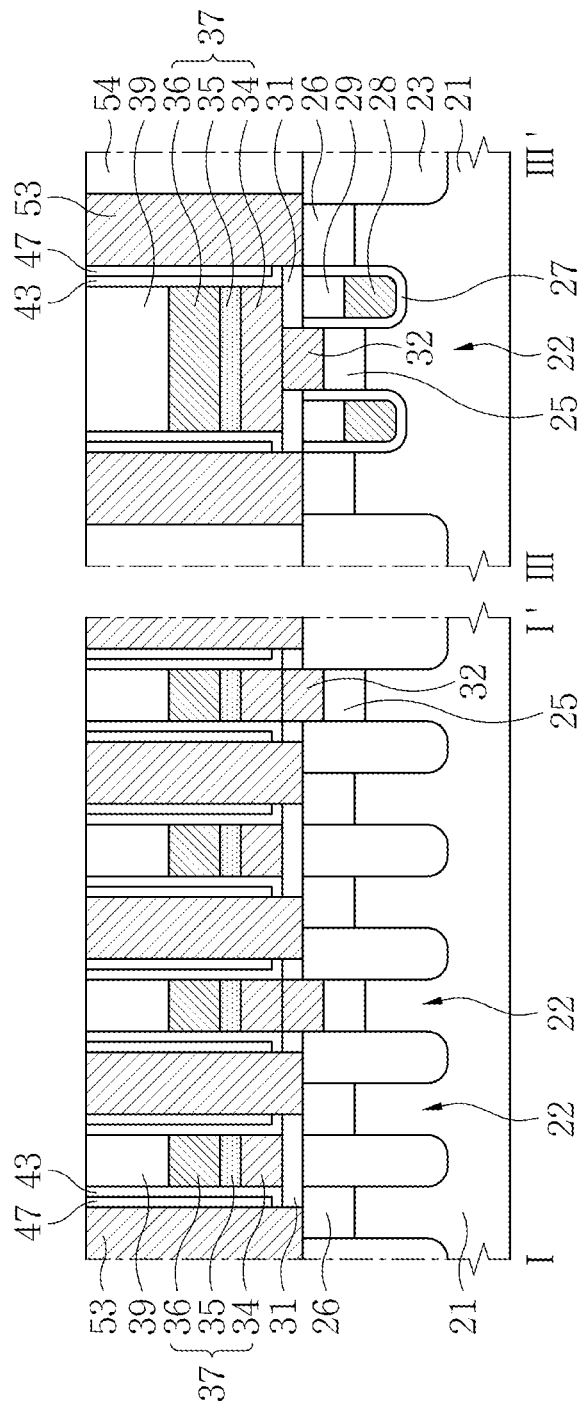
Figure 20B:
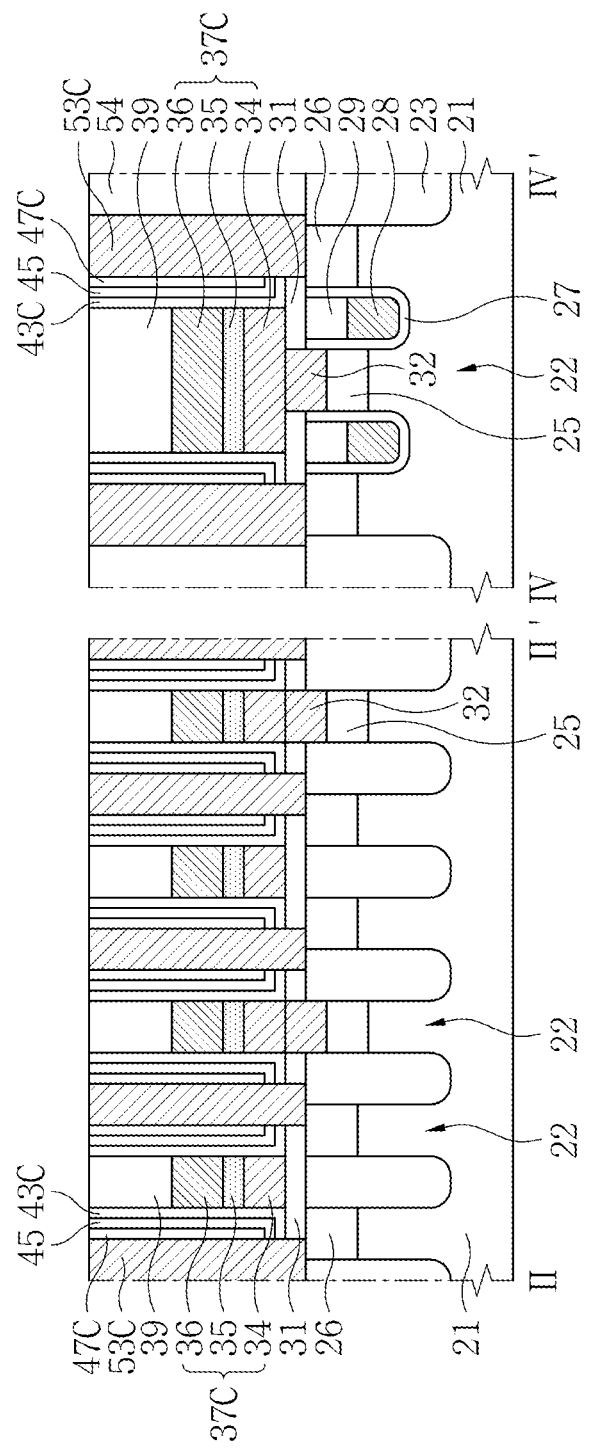

Referring to FIGS. 4, 20A, and 20B, the cell BC plugs 53C and the balancing BC plugs 53 may be patterned and divided to have desired sizes. A second interlayer insulating layer 54 may be formed between the cell BC plugs 53C and the balancing BC plugs 53. The second interlayer insulating layer 54 may be planarized to expose the cell BC plugs 53C, the balancing BC plugs 53, the bit capping pattern 39, the cell inner spacers 43C, the balancing inner spacers 43, the cell outer spacers 47C, the balancing outer spacers 47, and the sacrificial spacers 45. The planarization process may include a CMP process, an etch-back process, or a combination thereof. The second interlayer insulating layer 54 may include an insulating material, such as silicon oxide, silicon nitride, silicon oxynitride, or a combination thereof. For example, the second interlayer insulating layer 54 may be a silicon nitride layer.

Figure 21A:
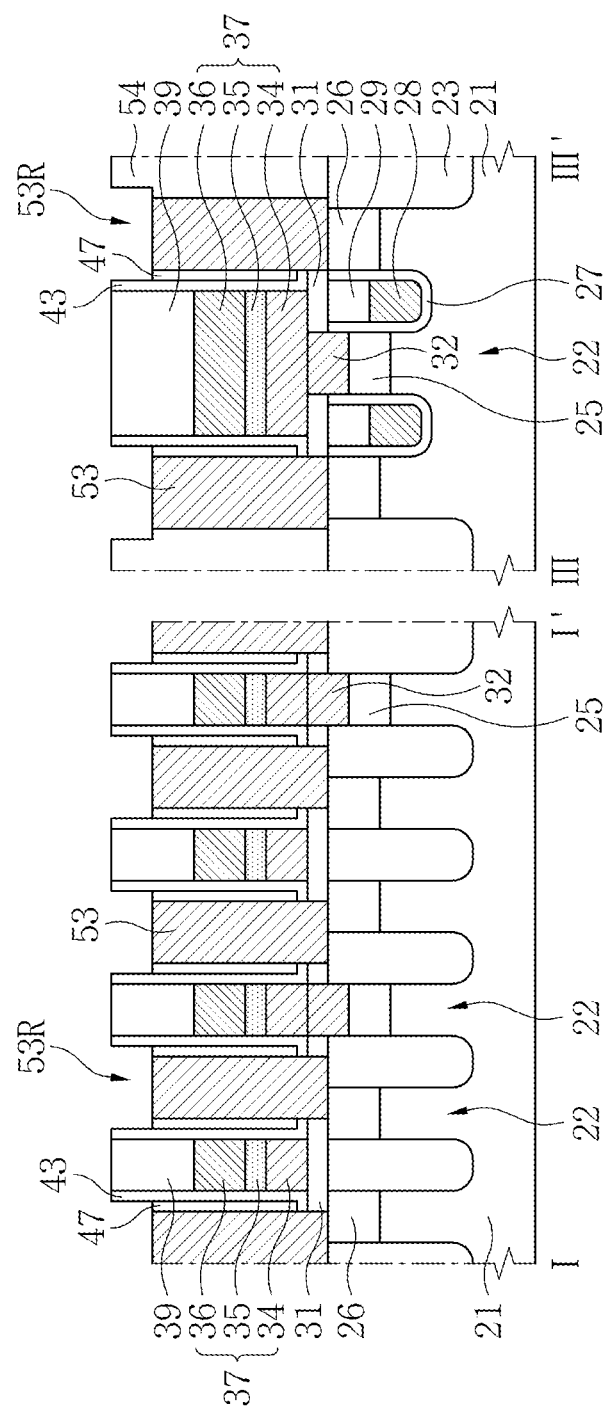
Figure 21B:
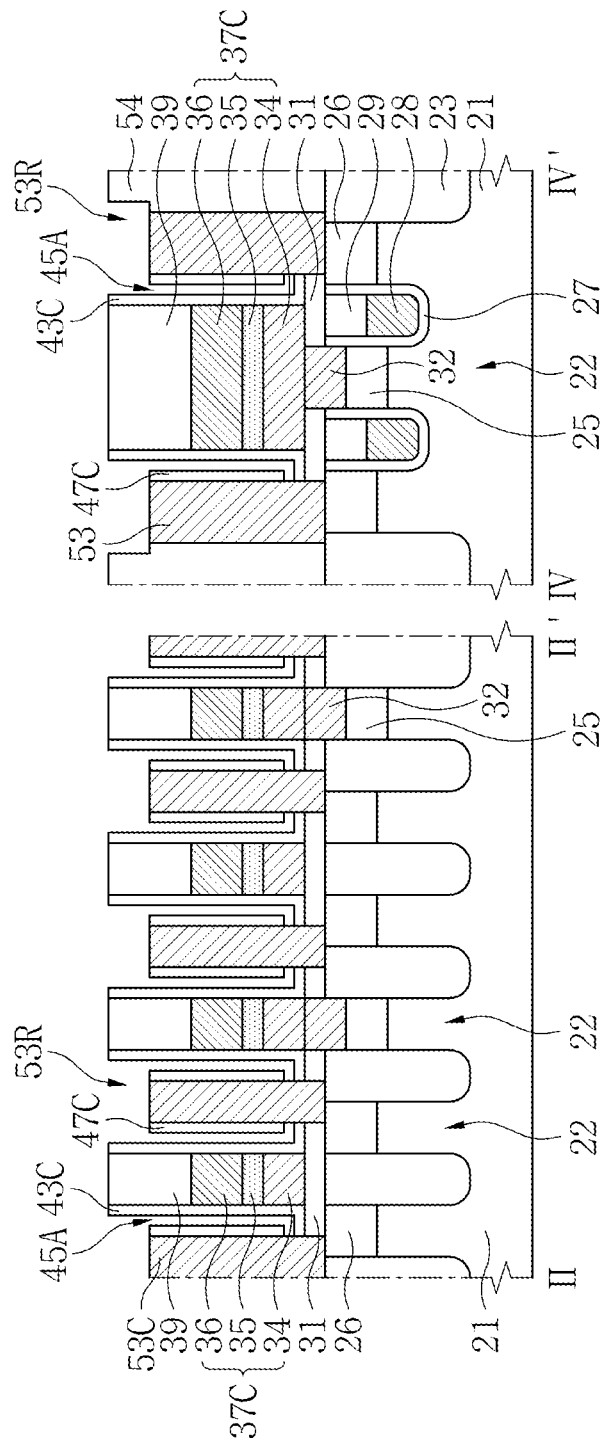

Referring to FIGS. 4, 21A, and 21B, air spacers 45A may be formed by removing the sacrificial spacers 45 located in the first cell block CA1. During the formation of the air spacers 45A, the balancing BC plugs 53 and the cell BC plugs 53C may be partially removed to form recess areas 53R. The removal of the sacrificial spacers 45 may include an isotropic etch process or a cleaning process. Each of the air spacers 45A may have an L-shape.

In at least one other example embodiment, the air spacers 45A may have a bar shape.

Figure 22A:
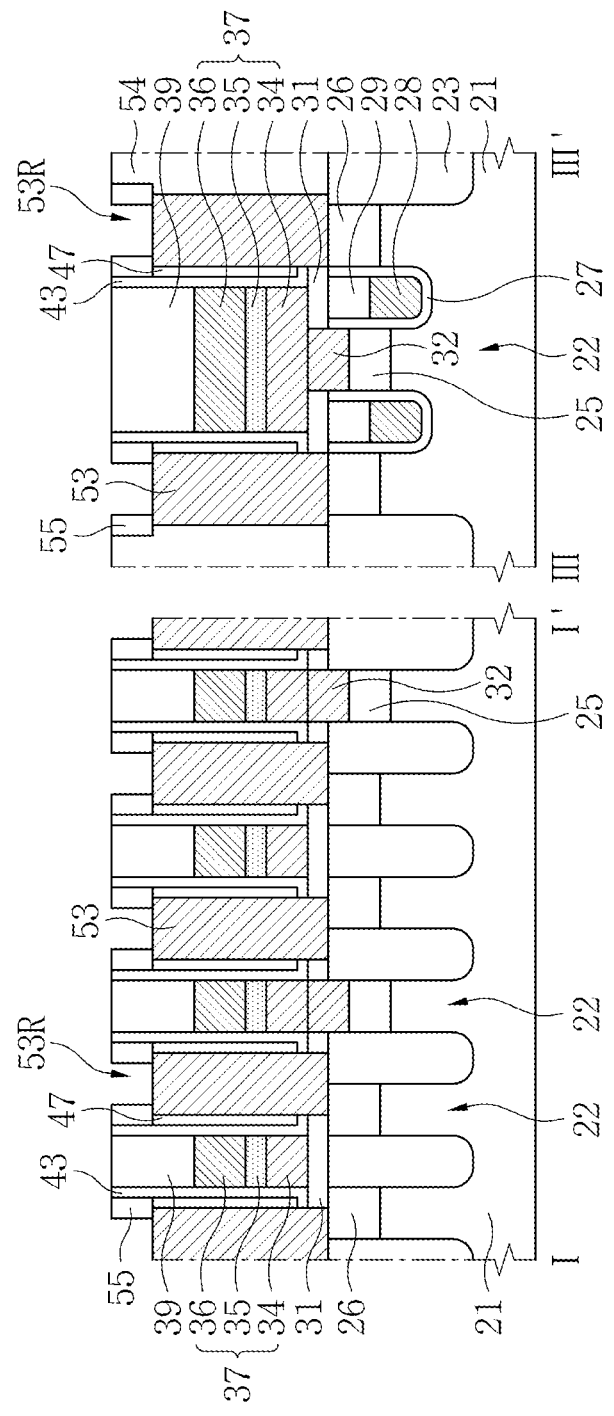
Figure 22B:
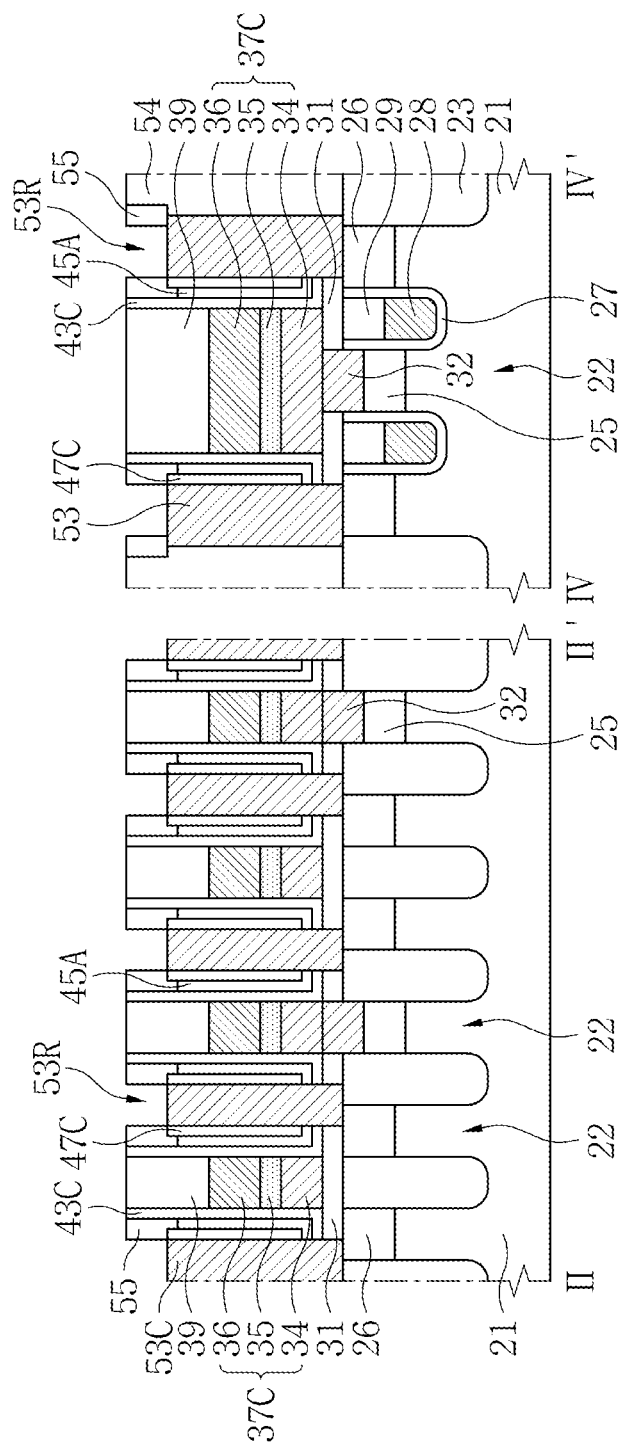

Referring to FIGS. 4, 22A, and 22B, upper spacers 55 may be formed on sidewalls of the recess areas 53R, using a thin-film formation process and an anisotropic etch process. The upper spacers 55 may include an insulating material, such as silicon oxide, silicon nitride, silicon oxynitride, or a combination thereof. The upper spacers 55 may cover the air spacers 45A. Upper ends of the cell BC plugs 53C and balancing BC plugs 53 may be exposed. The balancing bit lines 37, the balancing BC plugs 53, the balancing inner spacers 43, and the balancing outer spacers 47 may form a balancing capacitor. The balancing inner spacers 43 and the balancing outer spacers 47 may function as a capacitor dielectric layer.

Figure 23A:
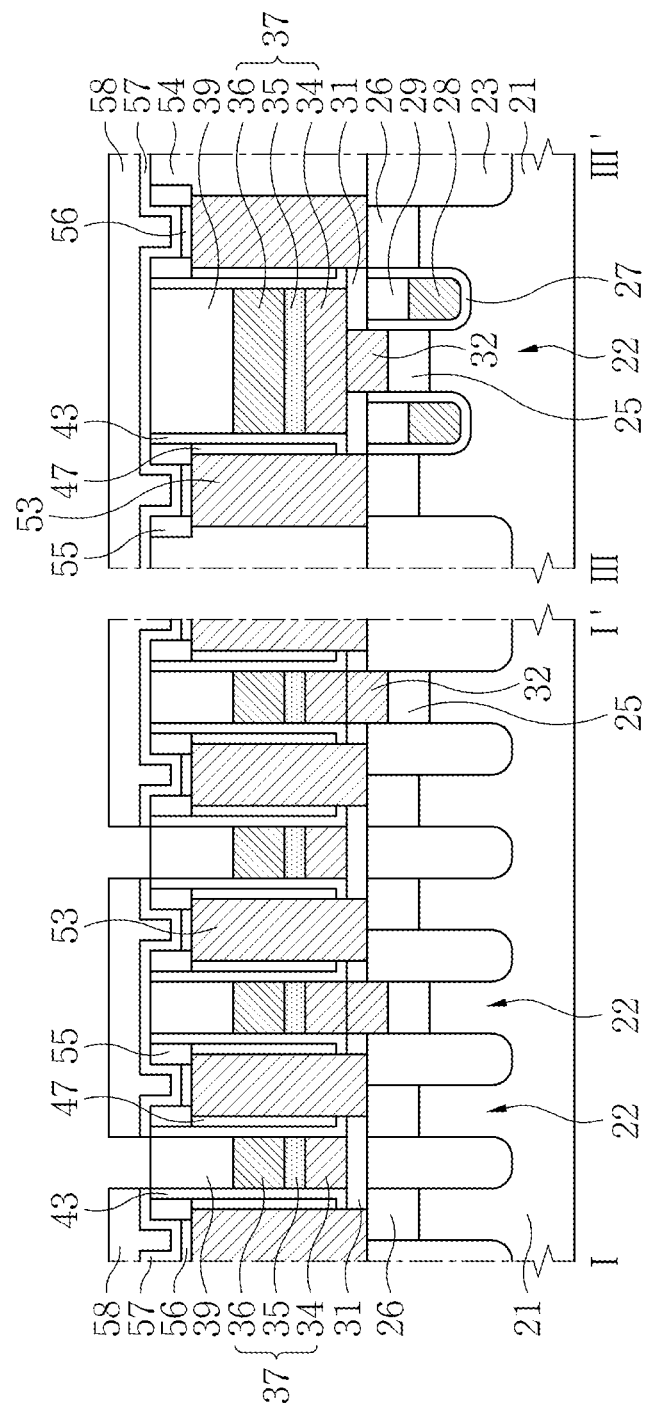
Figure 23B:
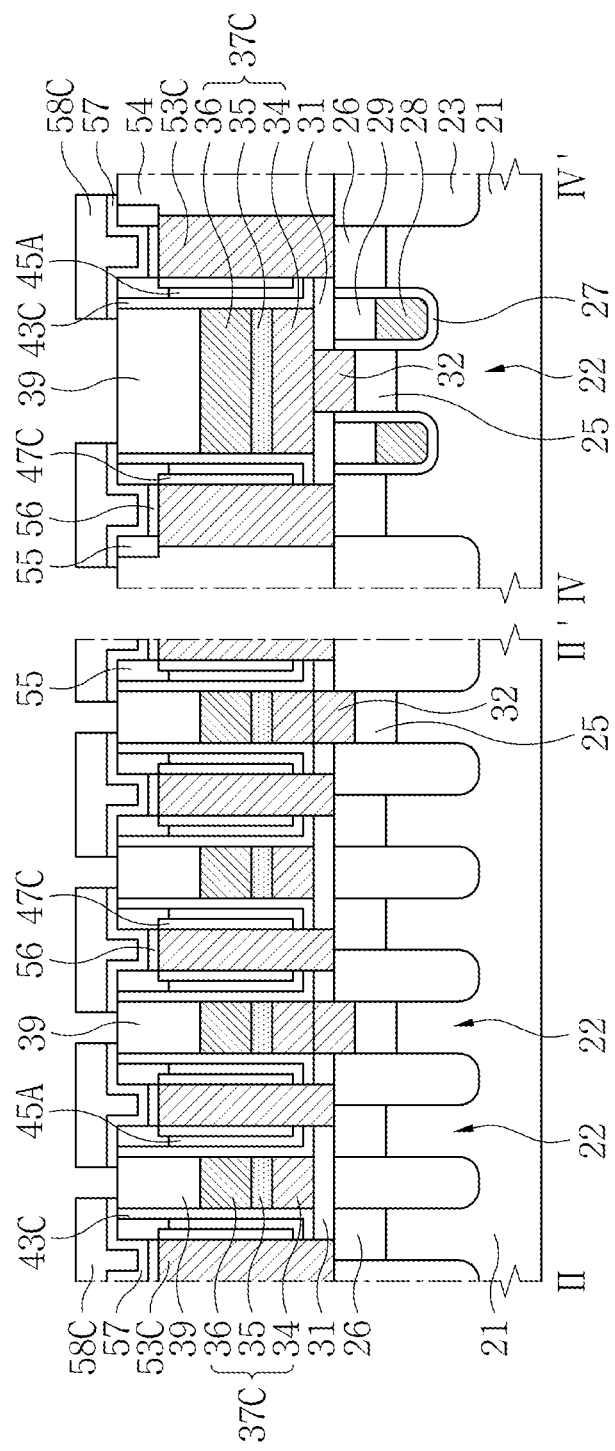

Referring to FIGS. 4, 23A, and 23B, a metal silicide layer 56 may be formed on the cell BC plugs 53C and the balancing BC plugs 53. A barrier layer 57 covering the entire surface of the semiconductor substrate 21 may be formed on the metal silicide layer 56. Intermediate interconnections 58 in the first balancing block B1 and landing pads 58C in the first cell block CA1 may be formed using a thin-film formation process and a patterning process. The barrier layer 57 may be retained under the intermediate interconnections 58 and the landing pads 58C.

The metal silicide layer 56 may include CoSi, NiSi, TiSi, TaSi, WSi, or a combination thereof. The barrier layer 57 may include Ti, TiN, Ta, TaN, or a combination thereof. The intermediate interconnections 58 and the landing pads 58C may include the same material formed at the same time. The intermediate interconnections 58 and the landing pads 58C may include W, WN, Ti, TiN, TiAlN, TiCN, Ta, TaN, TaAlN, TaCN, or a combination thereof.

Figure 24A:
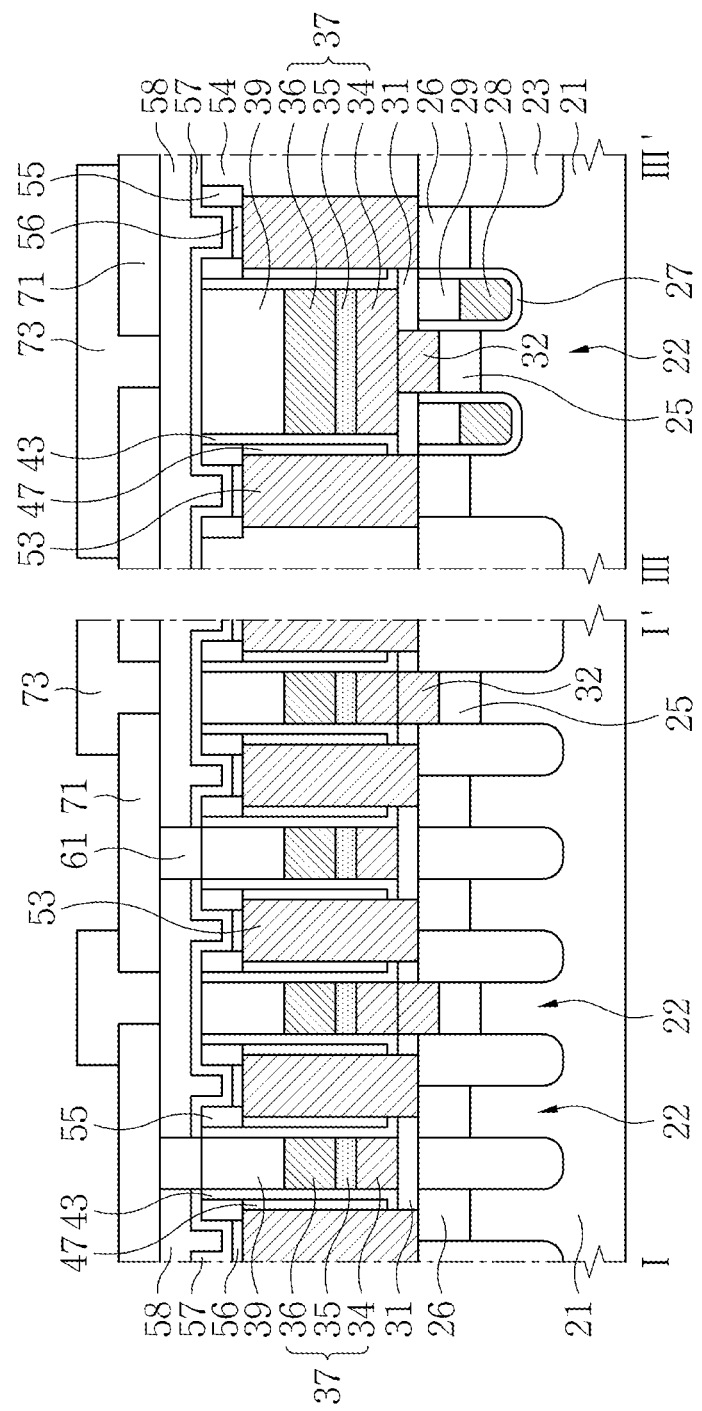
Figure 24B:
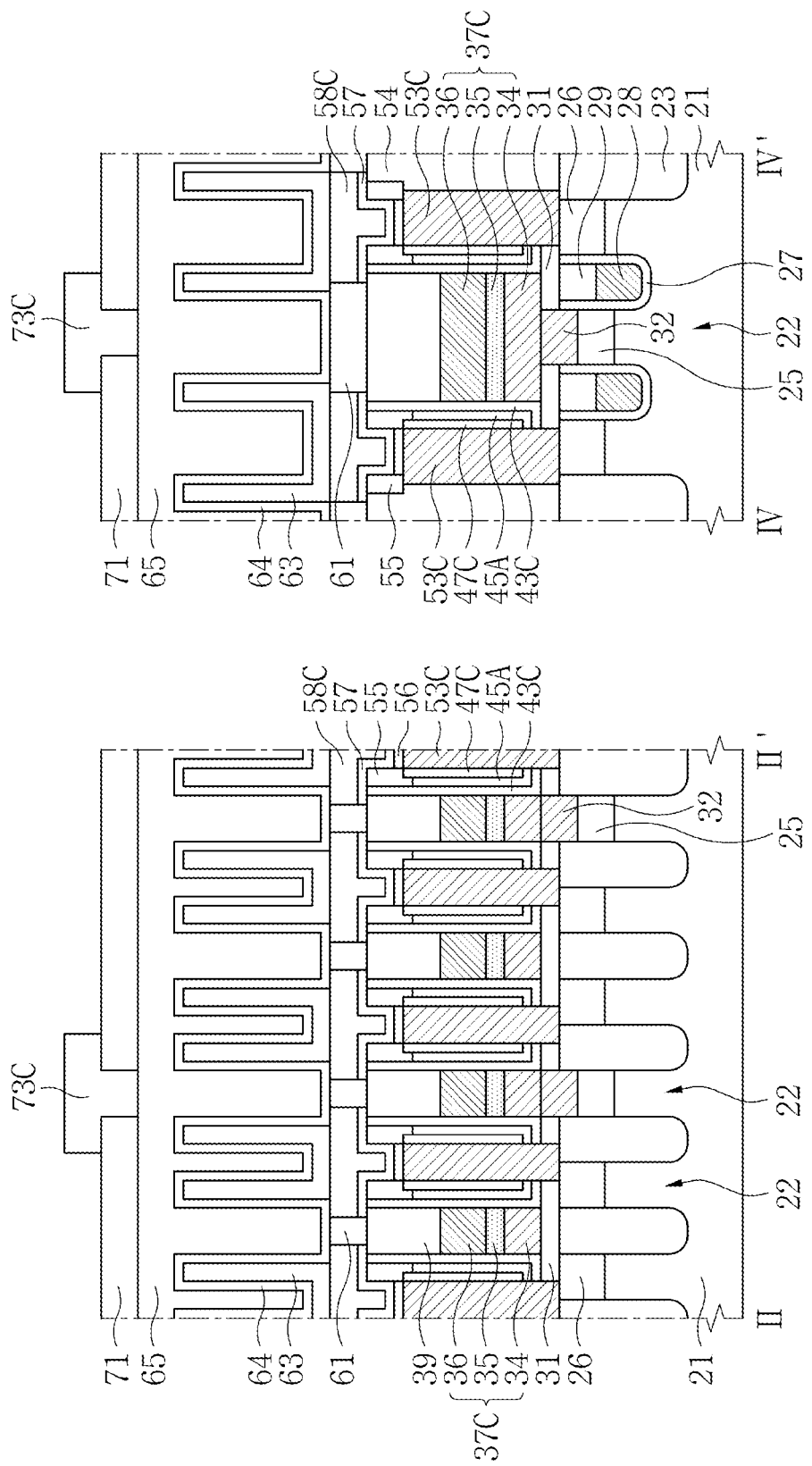

Referring to FIGS. 4, 24A, and 24B, a third interlayer insulating layer 61 filling gaps between the intermediate interconnections 58 and the landing pads 58C may be formed. Upper ends of the intermediate interconnections 58, landing pads 58C, and third interlayer insulating layer 61 may be formed at the substantially same level. Lower electrodes 63, a cell capacitor dielectric layer 64, and an upper electrode 65 may be sequentially formed in the first cell block CA1. A fourth interlayer insulating layer 71 covering the entire surface of the semiconductor substrate 21 may be formed. Balancing upper interconnections 73 and cell upper interconnections 73C may be formed on the fourth interlayer insulating layer 71. The lower electrodes 63, the cell capacitor dielectric layer 64, and the upper electrode 65 may form cell capacitors.

The third interlayer insulating layer 61 may include an insulating material, such as silicon oxide, silicon nitride, silicon oxynitride, or a combination thereof. The lower electrodes 63 may be connected to the landing pads 58C. Each of the lower electrodes 63 may have a vertical height greater than a horizontal width. Each of the lower electrodes 63 may have a cylinder shape, a crown shape, a pillar shape, or a combination thereof. The lower electrodes 63 may include Ti, TiN, TiAlN, TiCN, Ta, TaN, TaAlN, TaCN, Ru, RuO, Pt, or a combination thereof. The cell capacitor dielectric layer 64 may conformally cover side and upper surfaces of the lower electrodes 63. The upper electrode 65 may cover the side and upper surfaces of the lower electrodes 63. The cell capacitor dielectric layer 64 may be interposed between the lower electrodes 63 and the upper electrode 65. The cell capacitor dielectric layer 64 may include an insulating material, such as a high-K dielectric layer, silicon oxide, silicon nitride, silicon oxynitride, or a combination thereof. For example, the cell capacitor dielectric layer 64 may include HfO, HfSiO, AlO, TiAlO, TaAlO, or a combination thereof. The upper electrode 65 may include Ti, TiN, TiAlN, TiCN, Ta, TaN, TaAlN, TaCN, Ru, RuO, Pt, or a combination thereof.

The fourth interlayer insulating layer 71 may include an insulating material, such as silicon oxide, silicon nitride, silicon oxynitride, or a combination thereof. The balancing upper interconnections 73 may pass through the fourth interlayer insulating layer 71 to be connected to the intermediate interconnections 58. The cell upper interconnections 73C may pass through the fourth interlayer insulating layer 71 to be connected to the upper electrode 65. The balancing upper interconnections 73 and the cell upper interconnections 73C may include a conductive material, such as a metal layer.

Figure 25:
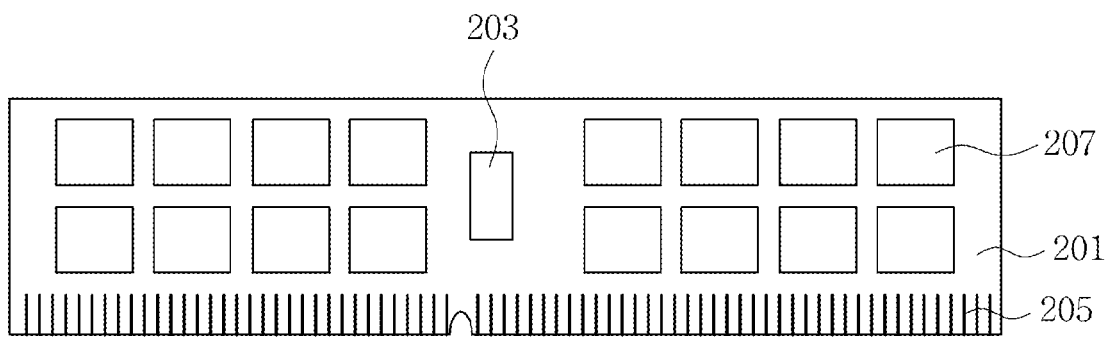
FIG. 25 is a layout for describing a semiconductor module in accordance with at least one example embodiment of inventive concepts.

FIG. 25 is a layout for describing a semiconductor module in accordance with at least one example embodiment of inventive concepts.

Referring to FIG. 25, the semiconductor module may include a module substrate 201, a plurality of semiconductor packages 207, and a control chip package 203. Input/output terminals 205 may be formed on the module substrate 201. The semiconductor packages 207 may include a configuration as described with reference to FIGS. 1 to 24B.

The semiconductor packages 207 and the control chip package 203 may be installed on the module substrate 201. The semiconductor packages 207 and the control chip package 203 may be electrically connected to the input/output terminals 205 in series/parallel. The control chip package 203 may be omitted. Each of the semiconductor packages 207 may include a volatile memory chip such as a DRAM and a static random access memory (SRAM), a non-volatile memory chip such as a flash memory, a phase change memory, a magnetic random access memory (MRAM), or a resistive random access memory (RRAM), or a combination thereof. The semiconductor module in accordance with at least one example embodiment of inventive concepts may be a memory module.

Figure 26:
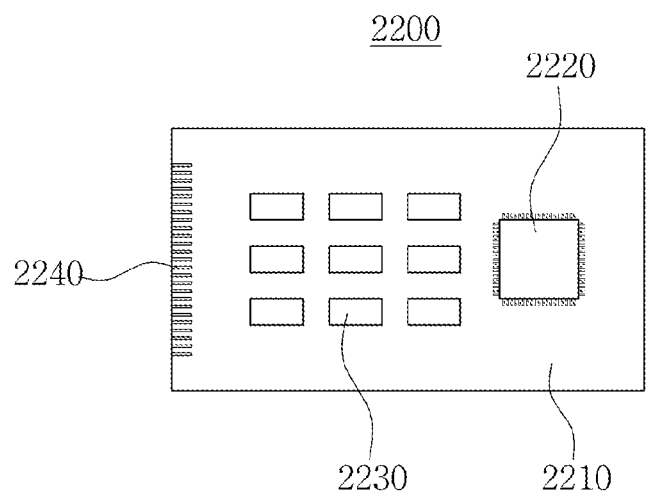
FIG. 26 is a view schematically showing a memory card including at least one semiconductor devices in accordance with at least one example embodiment of inventive concepts.

FIG. 26 is a view schematically showing a memory card 2200 including at a semiconductor device in accordance with at least one example embodiment of inventive concepts.

Referring to FIG. 26, the memory card 2200 may include a microprocessor 2220 and a plurality of semiconductor packages 2230 mounted on a memory card substrate 2210. At least one of the microprocessor 2220 and the semiconductor packages 2230 may include a configuration as described with reference to FIGS. 1 to 24B. Input/output terminals 2240 may be arranged on at least one side of the memory card substrate 2210.

Figure 27:
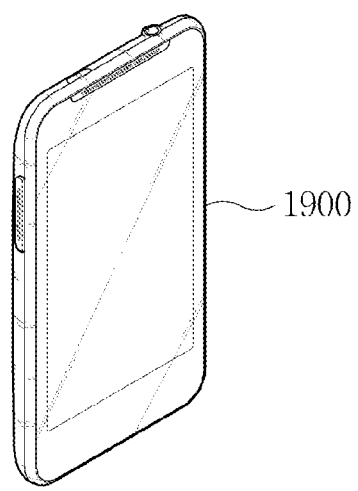
FIG. 27 is a perspective view showing an electronic apparatus in accordance with at least one example embodiment of inventive concepts.

FIG. 27 is a perspective view showing an electronic apparatus in accordance with at least one example embodiment of inventive concepts.

Referring to FIG. 27, the semiconductor devices as described with reference to FIGS. 1 to 24B may be usefully applied to electronic systems, such as a mobile phone 1900, a netbook, a laptop computer, or a tablet PC. For example, the semiconductor devices as described with reference to FIGS. 1 to 24B may be installed in a mainboard of the mobile phone 1900. Further, the semiconductor devices as described with reference to FIGS. 1 to 24B may be provided to an expansion apparatus, such as an external memory card, to be used combined with the mobile phone 1900.

The mobile phone 1900 may be understood as a tablet PC. In addition, at least one of the semiconductor devices in accordance with one or more embodiments of inventive concepts may be used in a portable computer such as a laptop computer, an MPEG-1 Audio Layer 3 (MP3) player, an MP4 player, a navigation apparatus, a solid state disk (SSD), a desktop computer, an automobile, or a home appliance, as well as the tablet PC.

Figure 28:
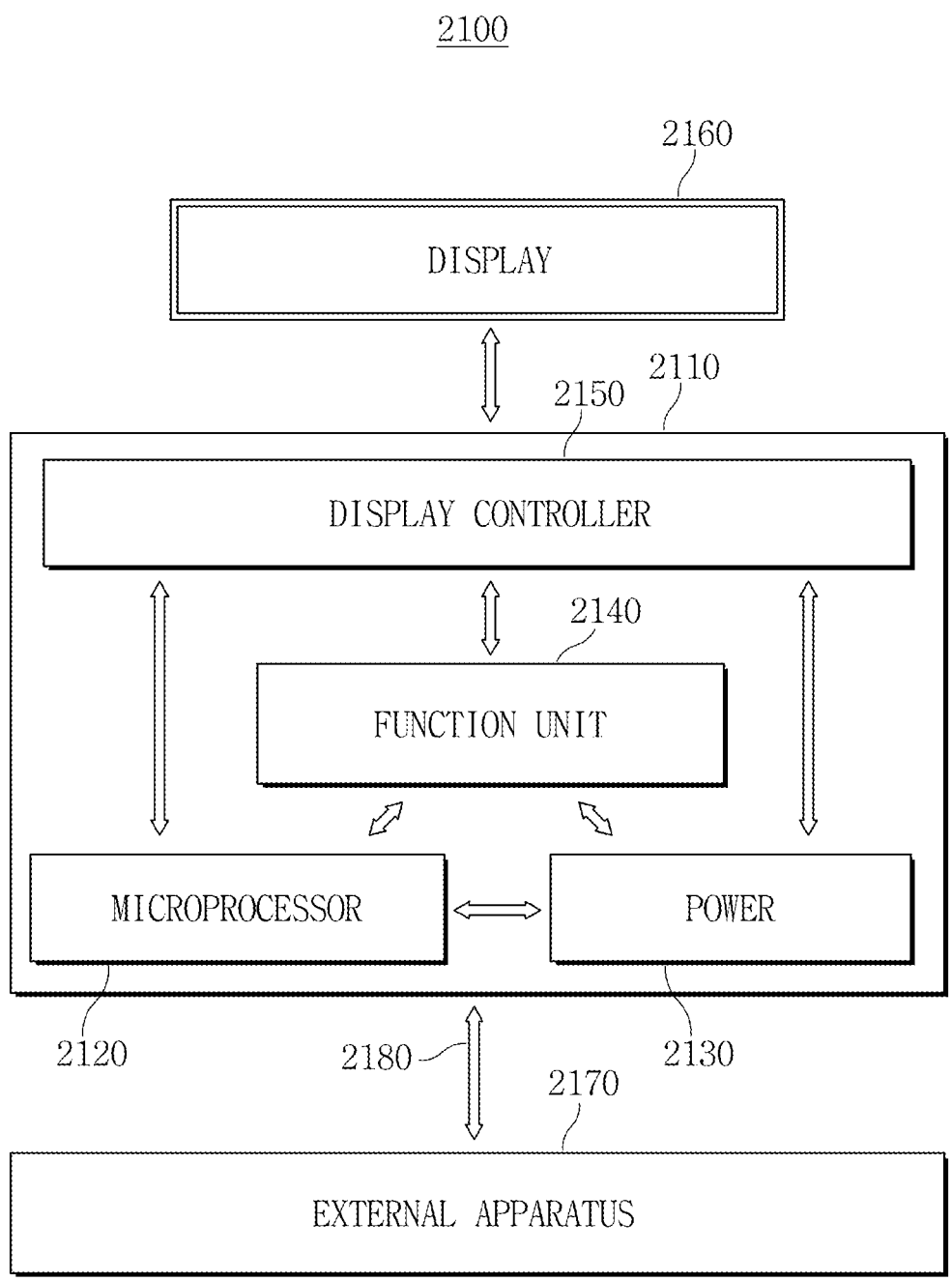
FIG. 28 is a system block diagram showing an electronic system in accordance with at least one example embodiment of inventive concepts.

FIG. 28 is a system block diagram showing an electronic system in accordance with at least one example embodiment of inventive concepts.

Referring to FIG. 28, the semiconductor devices as described with reference to FIGS. 1 to 24B may be applied to an electronic system 2100. The electronic system 2100 may include a body 2110, a microprocessor 2120, a power 2130, a function unit 2140, and a display controller 2150. The body 2110 may be a motherboard formed of a printed circuit board (PCB). The microprocessor 2120, the power 2130, the function unit 2140, and the display controller 2150 may be installed on the body 2110. A display 2160 may be arranged inside or outside of the body 2110. For example, the display 2160 may be arranged on a surface of the body 2110 and display an image processed by the display controller 2150.

The power 2130 may receive a constant voltage from an external battery, etc., divide the voltage into various levels, and supply those voltages to the microprocessor 2120, the function unit 2140, and the display controller 2150, etc. The microprocessor 2120 may receive a voltage from the power 2130 to control the function unit 2140 and the display 2160. The function unit 2140 may perform various functions of the electronic system 2100. For example, when the electronic system 2100 is a mobile phone, the function unit 2140 may have several components which perform functions of the mobile phone such as output of an image to the display 2160 or output of a voice to a speaker, by dialing or communication with an external apparatus 2170. If a camera is installed, the function unit 2140 may function as a camera image processor.

In at least one embodiment of inventive concepts, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

The semiconductor devices as described with reference to FIGS. 1 to 24B may be applied to the function unit 2140 or the microprocessor 2120.

Figure 29:
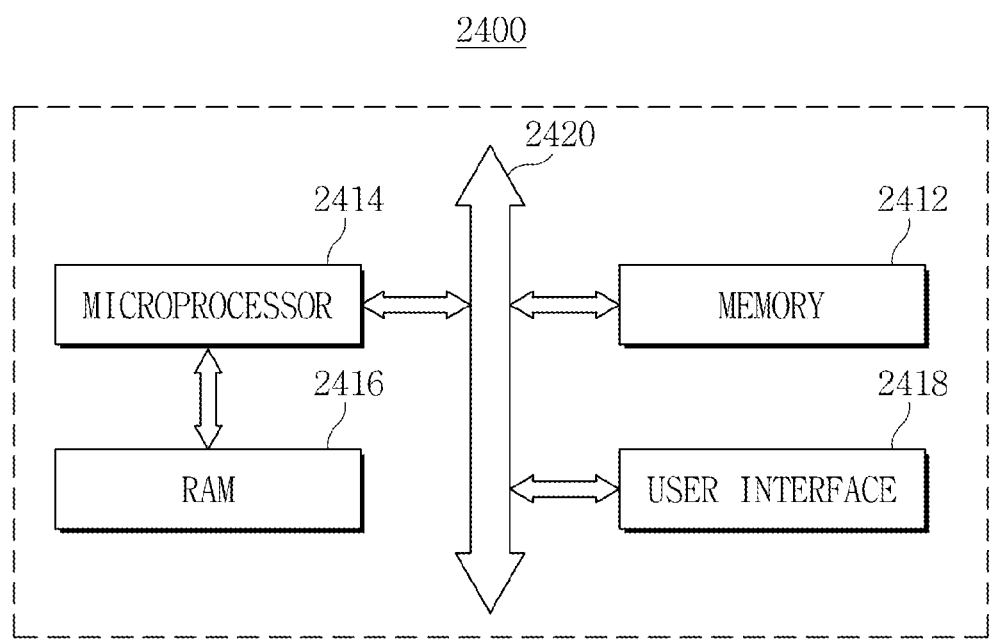
FIG. 29 is a block diagram schematically illustrating another electronic system including at least one of semiconductor devices in accordance with at least one example embodiment of inventive concepts.

FIG. 29 is a block diagram schematically illustrating another electronic system 2400 including at least one semiconductor device in accordance with at least one example embodiment of inventive concepts.

Referring to FIG. 29, the electronic system 2400 may include at least one semiconductor device in accordance with at least one example embodiment of inventive concepts. The electronic system 2400 may be used to fabricate a mobile apparatus or a computer. For example, the electronic system 2400 may include a memory 2412, a microprocessor 2414 performing data communication using a bus 2420, a random access memory (RAM) 2416, and a user interface 2418. The microprocessor 2414 may program and control the electronic system 2400. The RAM 2416 may be used as an operation memory of the microprocessor 2414. For example, the microprocessor 2414 or the RAM 2416 may include at least one semiconductor device in accordance with example embodiments of inventive concepts. The microprocessor 2414, the RAM 2416, and/or other components may be assembled in a single package. The user interface 2418 may be used to input data to, or output data from the electronic system 2400. The memory 2412 may store codes for operating the microprocessor 2414, data processed by the microprocessor 2414, or external input data. The memory 2412 may include a controller and a memory device.

In accordance with at least one example embodiment of inventive concepts, bit lines, cell inner spacers, air spacers, cell outer spacers, and cell BC plugs may be provided in a cell block. Due to the existence of the air spacers, parasitic capacitance between the cell BC plugs and the bit lines may be significantly reduced. Balancing bit lines, balancing inner spacers, balancing outer spacers, and balancing BC plugs may be provided in a balancing block. The balancing bit lines, the balancing inner spacers, the balancing outer spacers, and the balancing BC plugs may form a balancing capacitor. Capacitance between balancing BC plugs and the balancing bit lines may significantly increase. It is possible to implement a semiconductor device having a structure favorable for improving data transfer characteristics via the cell BC plugs and the bit lines, and for reducing the size of the balancing block.

The foregoing is illustrative of example embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of inventive concepts as defined in the claims.

What is claimed is:

1. A semiconductor device, comprising:
   a substrate including,
      a cell block,
      a balancing block, and
      a sense block disposed between the cell block and the balancing block;
   a plurality of cell bit lines formed in the cell block of the substrate;
   a plurality of cell plugs adjacent to side surfaces of the cell bit lines;

cell inner spacers formed between the cell bit lines and the cell plugs, the cell inner spacers being in contact with the side surfaces of the cell bit lines;

cell outer spacers formed on the cell inner spacers, the cell outer spacers being in contact with the cell plugs;

air spacers disposed between the cell inner spacers and the cell outer spacers;

a plurality of balancing bit lines formed in the balancing block of the substrate;

a plurality of balancing plugs adjacent to side surfaces of the balancing bit lines;

balancing inner spacers formed between the balancing bit lines and the balancing plugs, the balancing inner spacers being in contact with the side surfaces of the balancing bit lines; and balancing outer spacers formed on the balancing inner spacers, the balancing outer spacers being in contact with the balancing plugs, wherein at least some of the cell bit lines are connected to the sense block, the balancing bit lines are connected to the sense block, and the balancing bit lines, the balancing plugs, the balancing inner spacers, and the balancing outer spacers form a balancing capacitor.

2. The semiconductor device of claim 1, wherein the balancing outer spacers are in direct contact with the balancing inner spacers.

3. The semiconductor device of claim 1, wherein a first distance between the balancing plugs and the balancing bit lines is less than a second distance between the cell plugs and the cell bit lines.

4. The semiconductor device of claim 1, wherein each of the balancing inner spacers has substantially the same thickness as each of the cell inner spacers.

5. The semiconductor device of claim 1, wherein each of the balancing outer spacers has substantially the same thickness as each of the cell outer spacers.

6. The semiconductor device of claim 1, wherein each of the balancing plugs has a greater horizontal width than the cell plugs.

7. The semiconductor device of claim 6, wherein the horizontal width of at least one of the balancing plugs is about at least twice that of the cell plugs.

8. The semiconductor device of claim 1, wherein each of the air spacers has one of an L-shape, an I-shape, and a bar shape.

9. The semiconductor device of claim 1, wherein
the plurality of cell bit lines includes first and second cell bit lines parallel to each other in the cell block,
the plurality of balancing bit lines includes first and second balancing bit lines parallel to each other in the balancing block,
the first balancing bit line is arranged in the substantially same straight line as the first cell bit line, and the second balancing bit line is arranged in the substantially same straight line as the second cell bit line, and
the first cell bit line and the second balancing bit line are connected to a sense amplifier in the sense block.

10. The semiconductor device of claim 9, wherein the first and second balancing bit lines have substantially the same pitch as the first and second cell bit lines.

11. The semiconductor device of claim 9, wherein the first balancing bit line is connected to the second balancing bit line.

12. The semiconductor device of claim 1, further comprising:
lower electrodes disposed on the cell plugs;
a cell capacitor dielectric layer disposed on the lower electrodes; and
an upper electrode disposed on the cell capacitor dielectric layer, the upper electrode being configured to connect to a plate power supply.

13. The semiconductor device of claim 12, wherein the balancing plugs are configured to connect to the plate power supply.

14. A semiconductor device, comprising:
a substrate including,
a balancing block, and
a sense block;
a plurality of balancing bit lines formed in the balancing block of the substrate, the plurality of balancing bit lines being connected to the sense block;
a plurality of balancing plugs adjacent to side surfaces of the balancing bit lines;
balancing inner spacers formed between the balancing bit lines and the balancing plugs, the balancing inner spacers being in contact with the side surfaces of the balancing bit lines; and
balancing outer spacers formed on the balancing inner spacers, the balancing outer spacers being in contact with the balancing inner spacers and the balancing plugs, the balancing inner spacers and the balancing outer spacers being insulating materials,
wherein the balancing bit lines, the balancing plugs, the balancing inner spacers, and the balancing outer spacers form a balancing capacitor.

15. The semiconductor device of claim 14, wherein the balancing plugs are configured to connect to one of a ground and a plate power supply.

16. A semiconductor device, comprising:
a substrate including,
at least one sense block,
at least one balancing block connected to the at least one sense block, the at least one balancing block including,
at least one balancing bit line pair including a first balancing bit line connected to a second balancing bit line,
a first spacer and a second spacer sequentially stacked on opposite sides of each of the first and second balancing bit lines, and
at least one first contact plug formed adjacent to and in contact with each of the second spacers, and
at least one cell block connected to the at least one sense block, the at least one cell block including,
at least one cell bit line,
a third spacer, a fourth spacer and a fifth spacer sequentially stacked on opposite sides of the at least one cell bit line, and
at least one second contact plug formed adjacent to and in contact with each of the fifth spacers.

17. The semiconductor device of claim 16, wherein the fourth spacer is an air gap.

18. The semiconductor device of claim 17, wherein,
the first balancing bit line and the second balancing bit line are parallel to one another,
one of the first and second balancing bit lines is connected to a sense amplifier of the at least one sense block, and
the at least one cell bit line is connected to the sense amplifier.

19. The semiconductor device of claim 16, wherein a combined thickness of the first and second spacers is less than a combined thickness of the third, fourth, and fifth spacers.

* * * * *